United States Patent
Nagasaki et al.

(10) Patent No.: US 6,519,824 B2
(45) Date of Patent: Feb. 18, 2003

(54) ELECTRIC WIRING FORMING SYSTEM

(75) Inventors: Tatsuo Nagasaki, Yokohama (JP); Hiroyoshi Kobayashi, Hachioji (JP); Toshihiro Kitahara, Tachikawa (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/816,554

(22) Filed: Mar. 23, 2001

(65) Prior Publication Data

US 2001/0032387 A1 Oct. 25, 2001

(30) Foreign Application Priority Data

Mar. 24, 2000 (JP) ........................................ 2000-083673

(51) Int. Cl.[7] .......................... H05K 3/10; B22D 27/09; B05D 5/12
(52) U.S. Cl. ........................ 29/33 M; 29/846; 164/113; 427/96
(58) Field of Search ................................ 29/33 M, 829, 29/840, 846; 427/96; 228/254, 180.22, 33; 248/362; 222/590, 593, 591; 219/121.63, 209; 164/113, 271, 462

(56) References Cited

U.S. PATENT DOCUMENTS

| | | | | |
|---|---|---|---|---|
| 4,082,869 A | * | 4/1978 | Raymond | 118/405 |
| 5,065,932 A | * | 11/1991 | Hayden et al. | 219/209 |
| 5,145,715 A | * | 9/1992 | Asano et al. | 427/123 |
| 5,374,021 A | * | 12/1994 | Kleinman | 248/362 |
| 5,377,961 A | * | 1/1995 | Smith et al. | 222/590 |
| 5,529,634 A | * | 6/1996 | Miyata et al. | 118/300 |
| 5,685,357 A | * | 11/1997 | Kato et al. | 164/113 |
| 5,746,368 A | * | 5/1998 | Straub et al. | 228/33 |
| 5,772,106 A | * | 6/1998 | Ayers et al. | 228/254 |
| 5,860,575 A | * | 1/1999 | Akin et al. | 222/593 |
| 6,046,426 A | * | 4/2000 | Jeantette et al. | 219/121.63 |
| 6,073,817 A | * | 6/2000 | Jairazbhoy | 222/591 |
| 6,202,734 B1 | * | 3/2001 | Sackinger et al. | 164/271 |
| 6,234,379 B1 | * | 5/2001 | Donges | 228/180.22 |

FOREIGN PATENT DOCUMENTS

| | | | | |
|---|---|---|---|---|
| DE | 3728151 | * | 3/1989 | 29/33 M |
| JP | 57-176172 | * | 10/1982 | 29/33 M |
| JP | 2-174187 | * | 7/1990 | 29/33 M |
| JP | 8-17269 | | 2/1996 | |

* cited by examiner

Primary Examiner—William Briggs
(74) Attorney, Agent, or Firm—Frishauf, Holtz, Goodman & Chick, P.C.

(57) ABSTRACT

A wiring board manufacturing system, which is an electric wiring forming system, utilizes a magnesium alloy as a conductive metal for wiring pattern forming, and mixes and heats the magnesium alloy chips thereof in a cylinder (feeding unit) with a built-in screw, melting same into an alloy slurry of a thixotropic state. The alloy slurry thereof is discharged onto a board. The board is mounted on a work stage of a stage unit, which is driven and controlled in accordance with wiring pattern data inputted by a CAD or the like, and a wiring pattern is formed on the board with the discharged alloy. According to this system, it is possible to provide an electric wiring forming system, which does away with the effects on the environment resulting from waste liquid at manufacturing, enables manufacturing time to be shortened, and moreover, uses an inexpensive metallic material for forming a wiring pattern.

26 Claims, 25 Drawing Sheets

ELECTRIC WIRING FORMING SYSTEM

The application claims the benefit of Japanese Application No. 2000-083673 filed in Japan on Mar. 24, 2000, the contents of which are incorporated by this reference.

BACKGROUND OF THE INVENTION

1. Field of the Invention

The present invention relates to an electric wiring forming system for forming wiring patterns on the material of a board for mounting electrical elements.

2. Description of the Related Art

In a common conventional method for manufacturing either a hard-type printed wiring board or flexible printed wiring board on which are mounted electrical elements, such as the ICs incorporated into electronic equipment, a glass fiber reinforced epoxy resin board, for example, is utilized as a nonconductive polymer, and a copper foil board that has copper foil, which is a conductive metal layer, plated over the entire surface thereof, is used. Chemical etching is performed on the above-mentioned copper foil board, copper foil other than the wiring pattern part is removed, leaving only the copper foil of the conductive pattern part, and a printed wiring board is achieved. Furthermore, there are cases in which plating is applied to the above-mentioned copper foil conductive pattern part. Furthermore, a dichromate solution is generally used as the etching solution for the above-mentioned chemical etching process.

Conversely, when forming a wiring pattern on a printed wiring board, the circuit writer technology disclosed in Japanese Patent Publication No. H 8-17269 as a method that does not make use of the above-mentioned copper foil board is a technology for manufacturing the above-mentioned printed wiring board by using a nonconductive insulating board material (blank) that is not a copper foil, and applying by extrusion a paste-like conductive material along a wiring pattern locus on the above-mentioned board material. A conductive paste, which is a paste-like conductive polymer in which an epoxy resin is mixed with a metal (silver flakes, silver clusters, silver balls), is used as the conductive material for forming the above-mentioned wiring pattern.

According to the conventional electric wiring printed wiring board manufacturing method, which uses the above-mentioned copper foil board, first of all, because of the long hours needed to prepare for volume production, such as the preparation of a mask for a wiring pattern, this conventional method is not suitable for cases that call for small lot production and short delivery times. Further, the plating and other processes for the above-mentioned wiring pattern part require several hours, and manufacturing time is long. Furthermore, with the conventional method, waste liquid treatment is essential during chemical etching, making it undesirable from the standpoint of the environment.

Further, with a circuit writer of the above-mentioned Japanese Patent Publication No. H 8-17269, because silver material, which is a precious metal, is used as the conductive material for forming a circuit pattern, the cost of a printed wiring board increases, and its applicability is also limited. Further, the above-mentioned circuit writer uses a carriage, on which are mounted a tank that holds the conductive paste along the shape of a wiring pattern, a conductive paste discharge opening, and a heater arranged in the vicinity of the discharge opening, and the carriage thereof must be driven and controlled along two axes in the X, Y directions. Consequently, the above-mentioned tank- and heater-equipped carriage has to be moved integrally, and movement positioning control can be difficult to carry out, the support structures for the tank and carriage are complex, equipment costs can increase, and inspection and maintenance has proved difficult at times.

SUMMARY OF THE INVENTION

The present invention is designed to solve the above-mentioned deficiencies, and an object thereof is the provision of an electric wiring forming system, which is a system for manufacturing an electric wiring board, and which eliminates the impact on the environment resulting from waste liquid during board manufacturing, reduces the time for board manufacturing preparation, uses inexpensive metal material for wiring pattern forming, and furthermore, also has a system which has a simple configuration.

An electric wiring forming system of the present invention comprises: a cylinder, comprising a heater for melting a conductive metal; a screw for discharging the above-mentioned conductive metal; a drawing die for forming a desired discharge diameter in a discharge opening for discharging a conductive metal onto a board for mounting electrical elements; a moving stage for moving the above-mentioned board for mounting electrical elements; and a controlling device for controlling the movement of the above-mentioned moving stage, and in the above-mentioned electric wiring forming system, the above-mentioned board for mounting electrical elements is mounted on the above-mentioned moving stage, and is laid out having a predetermined clearance relative to the above-mentioned drawing die. Then, the above-mentioned conductive metal, which is melted, is discharged via the above-mentioned drawing die onto the above-mentioned board for mounting electrical elements, and a desired wiring pattern is formed.

Other characteristics and benefits of the present invention will be made clear by means of the following explanation.

DETAILED DESCRIPTION OF THE PREFERRED EMBODIMENTS

The aspects of the embodiments of the present invention will be explained hereinbelow by referring to the figures.

Figure 1:
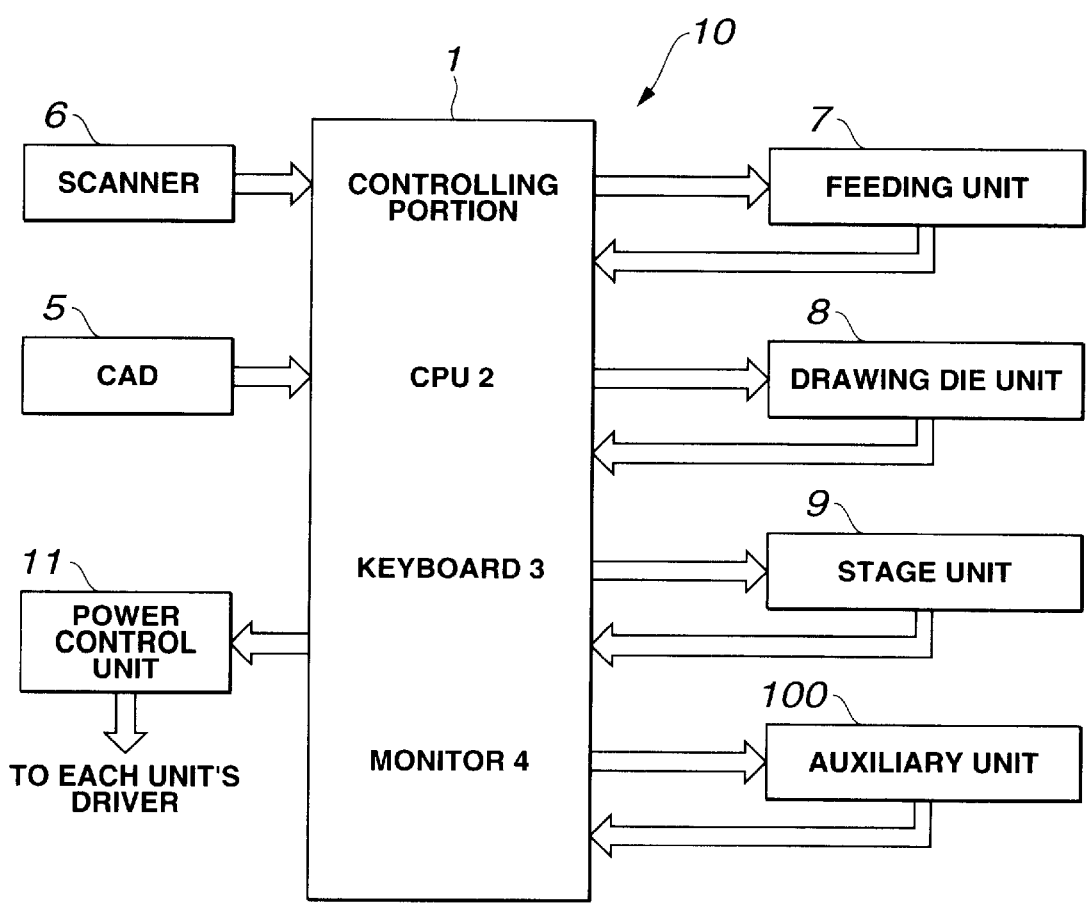
FIG. 1 is a block diagram of the main elements of a wiring board manufacturing system, which is an electric wiring forming system of a first embodiment of the present invention, and an external view of the system as a whole.
Figure 2:
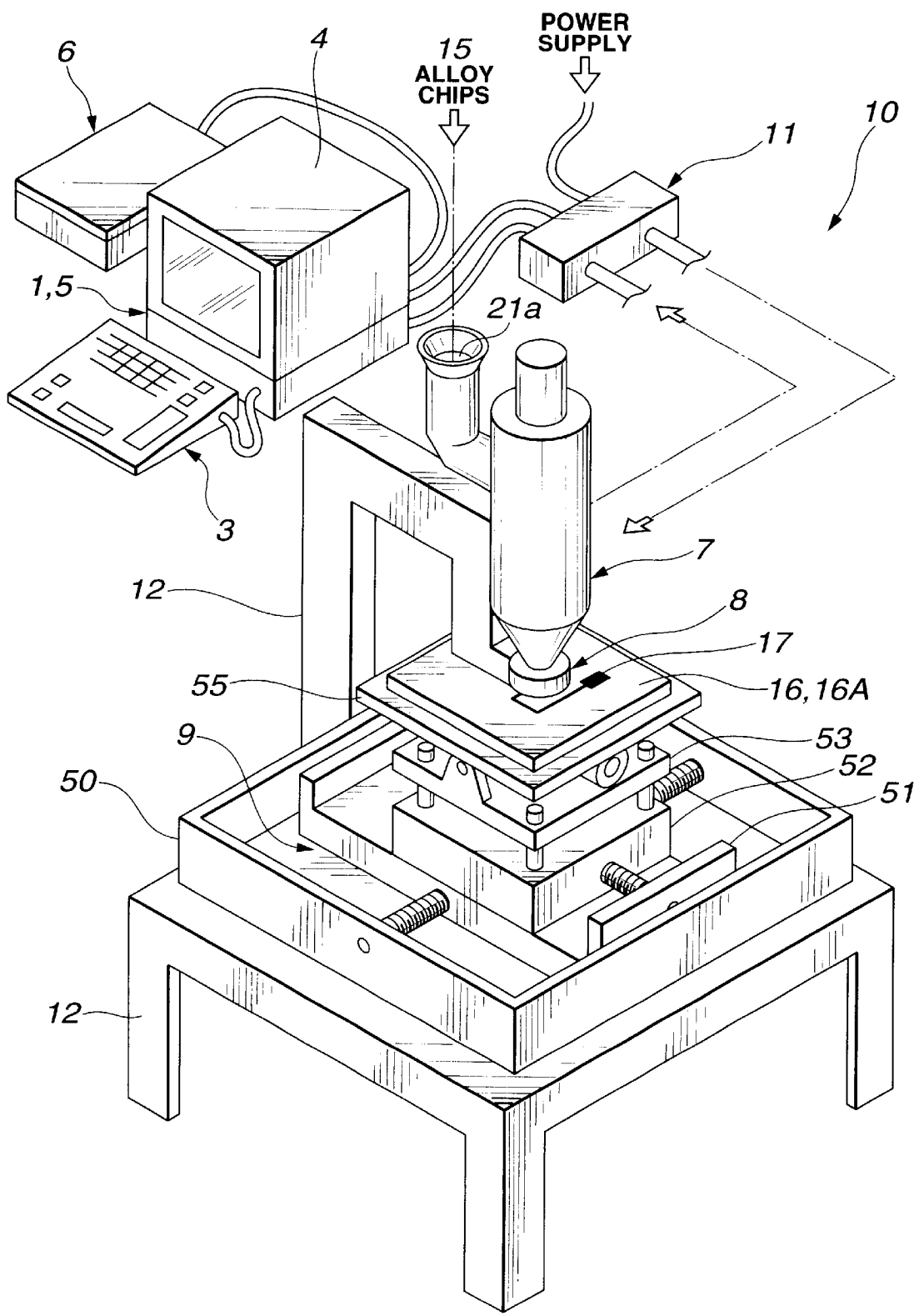
FIG. 2 is an external view of the entire system of a wiring board manufacturing system of the first embodiment of FIG. 1.
Figure 3:
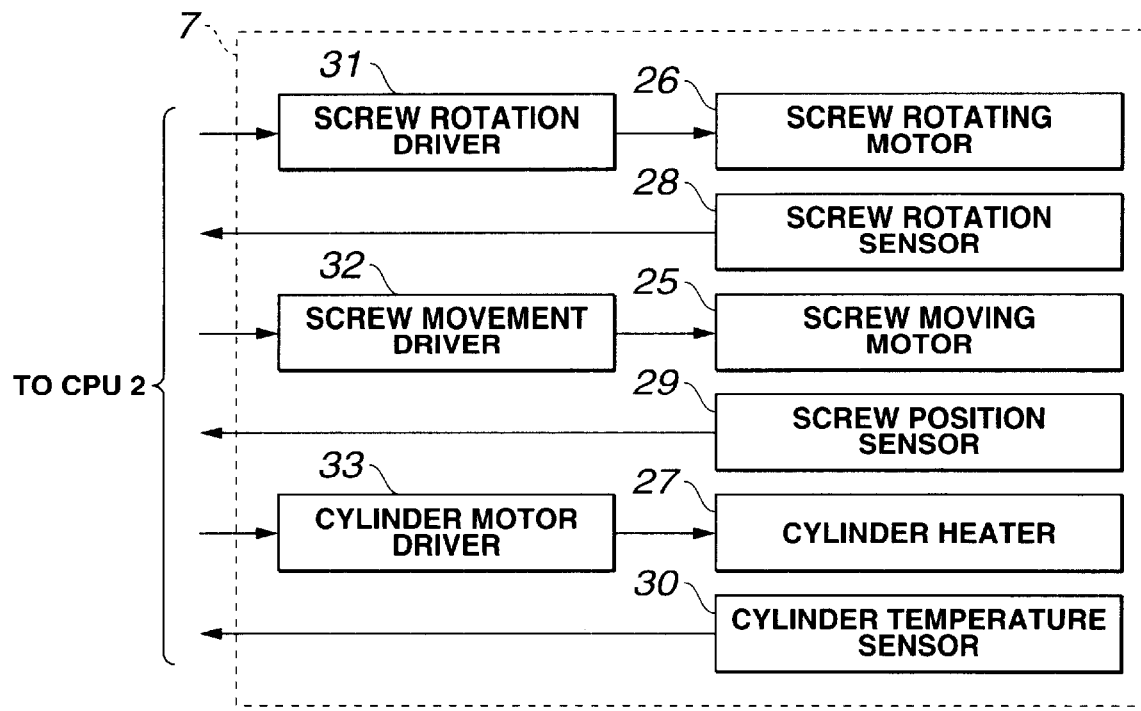
FIG. 3 is an electrical control block diagram of a feeding unit constituting a wiring board manufacturing system of the first embodiment of FIG. 1.
Figure 4:
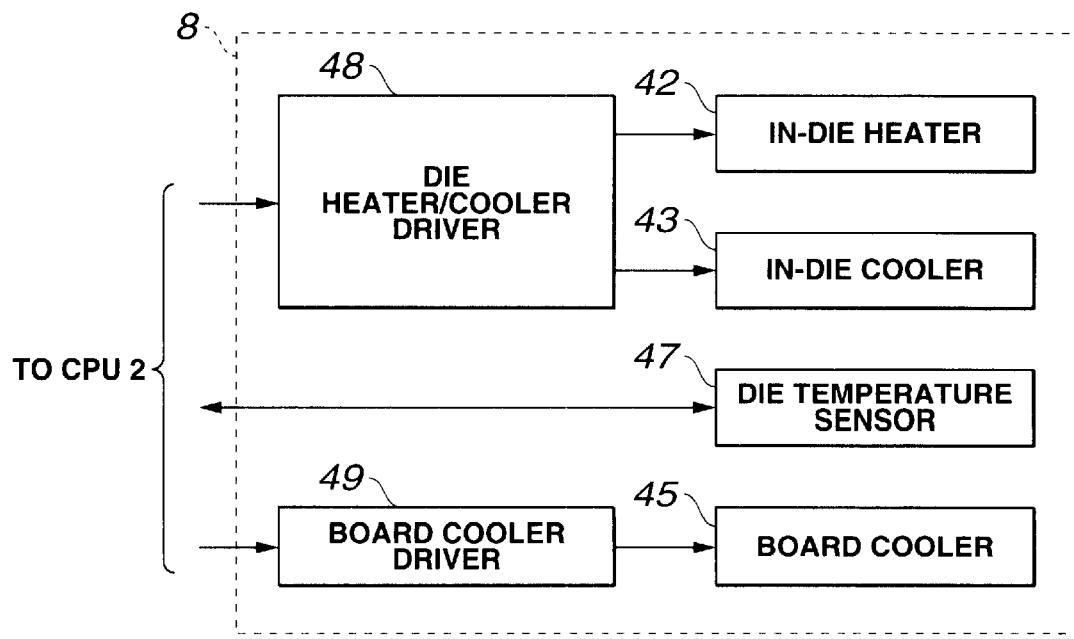
FIG. 4 is an electrical control block diagram of a drawing die unit constituting a wiring board manufacturing system of the first embodiment of FIG. 1.
Figure 5:
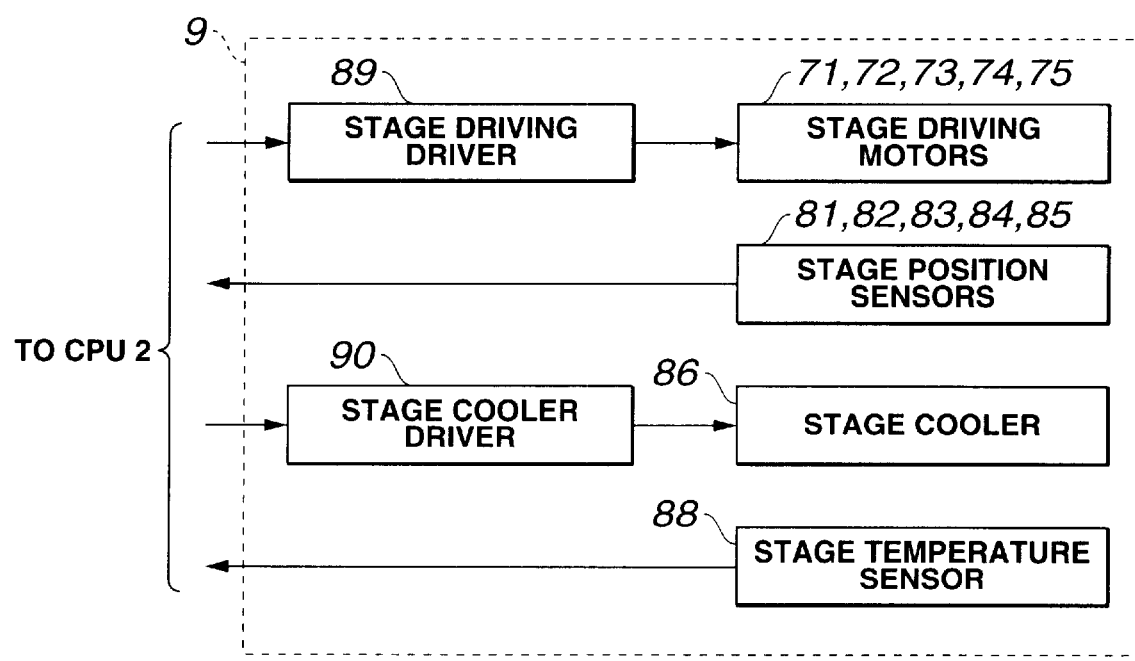
FIG. 5 is an electrical control block diagram of a stage unit constituting a wiring board manufacturing system of the first embodiment of FIG. 1.
Figure 6:
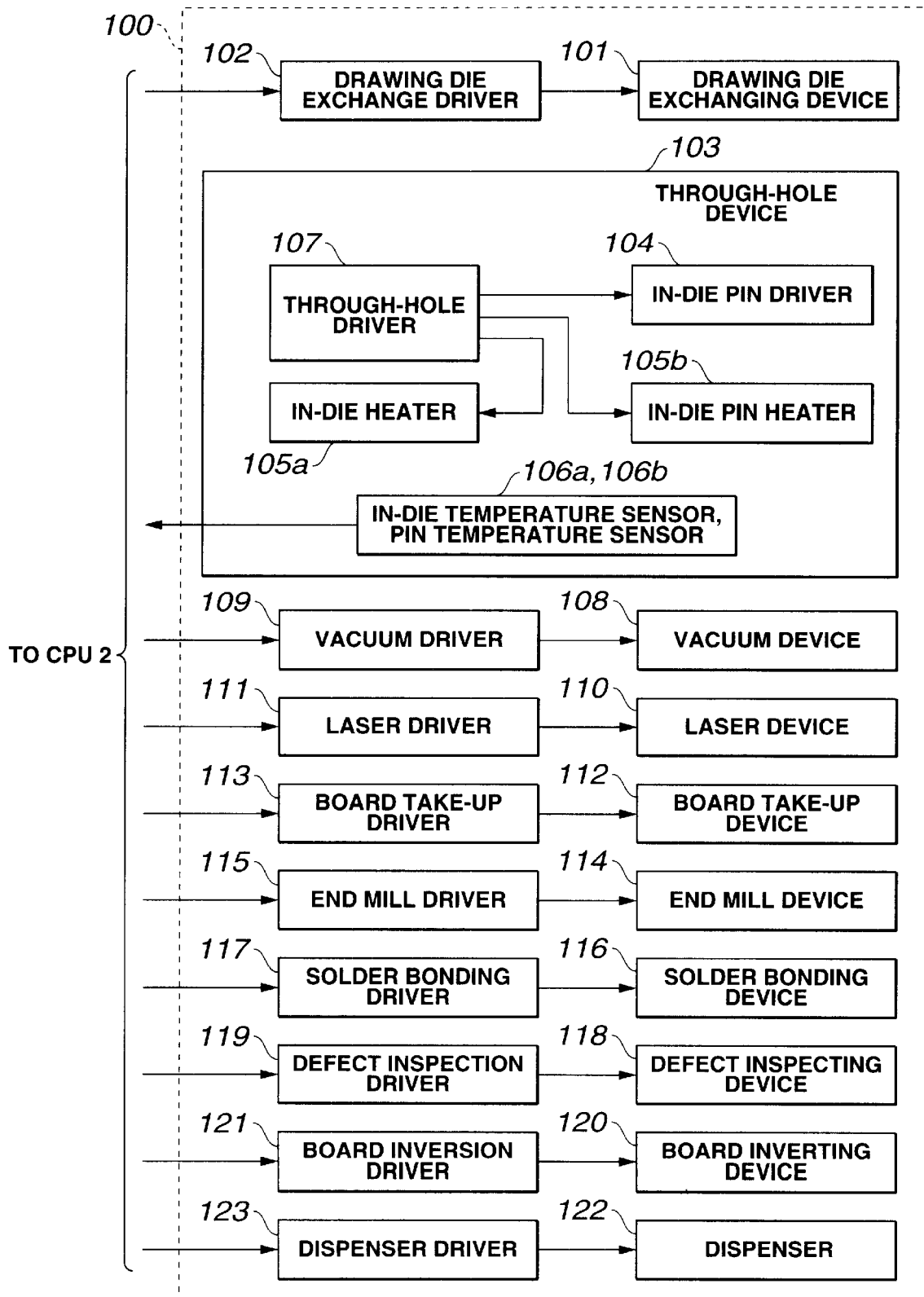
FIG. 6 is an electrical control block diagram of an auxiliary unit constituting the above-mentioned wiring board manufacturing system of the first embodiment of FIG. 1.
Figure 7:
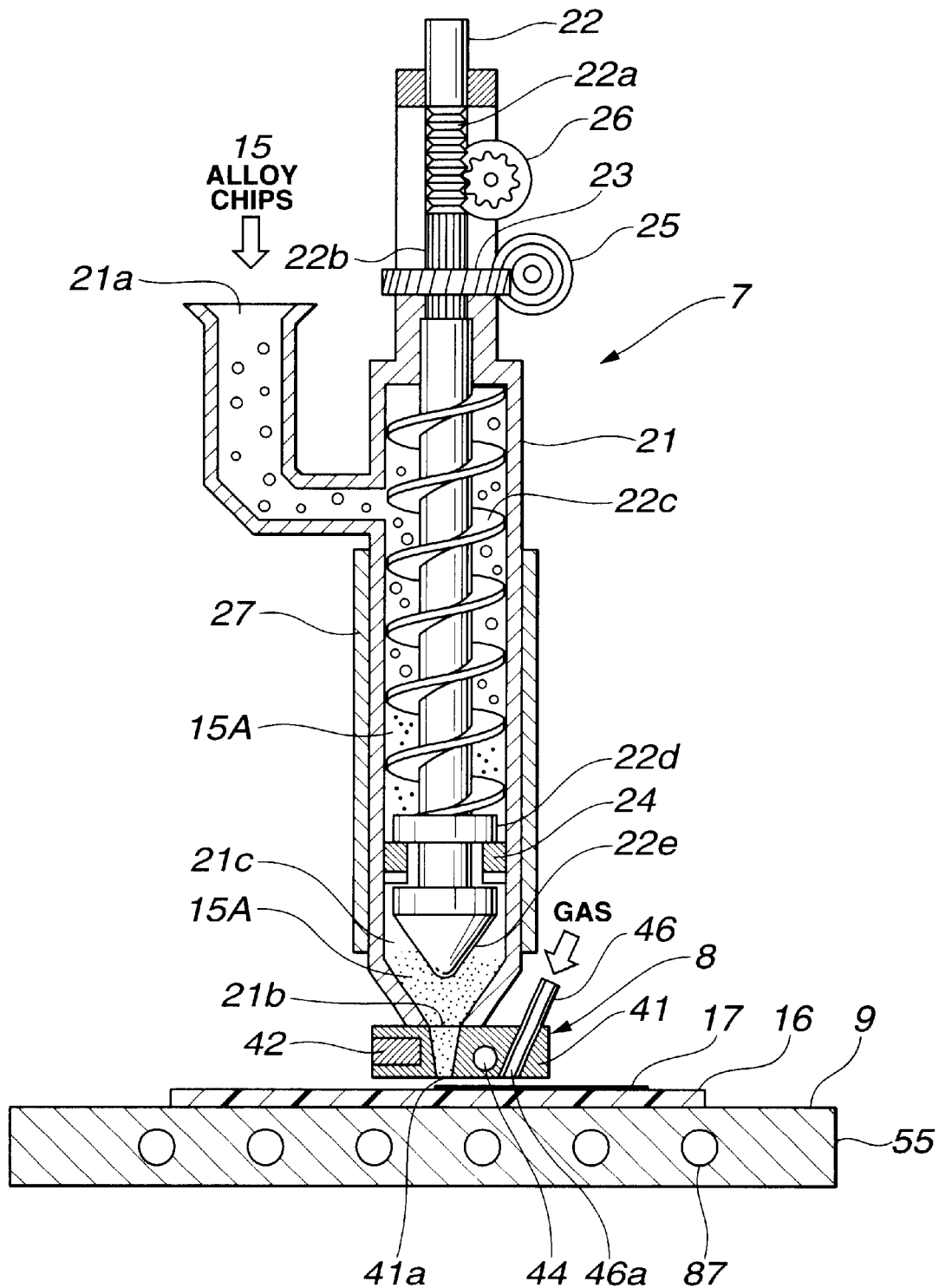
FIG. 7 is a longitudinal cross-sectional view showing the mechanism parts of a feeding unit and drawing die unit constituting the above-mentioned wiring board manufacturing system of the first embodiment of FIG. 1.
Figure 8:
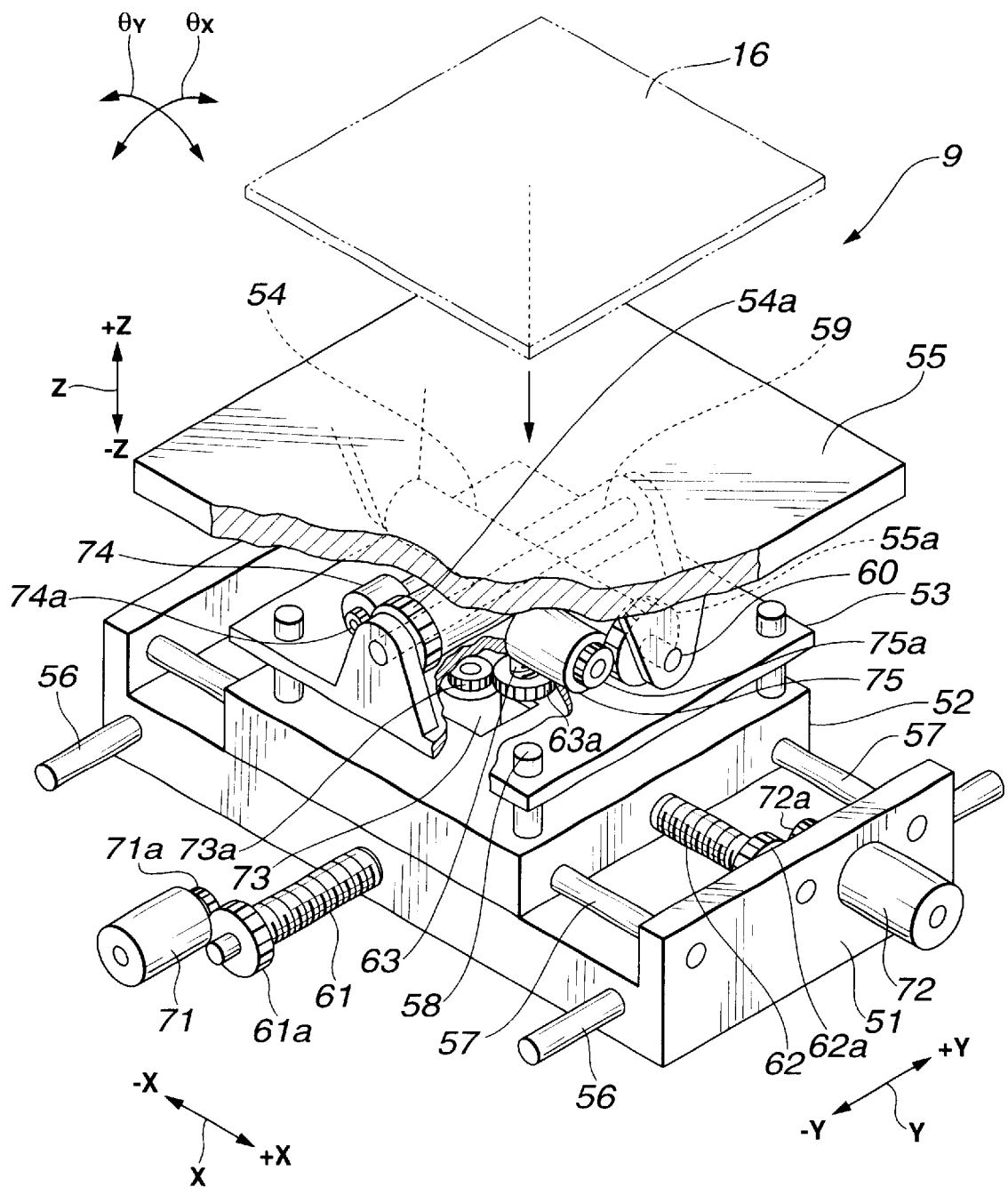
FIG. 8 is a perspective view showing the mechanism parts of a stage unit constituting the above-mentioned wiring board manufacturing system of the first embodiment of FIG. 1.

FIGS. 1 and 2 are block diagrams of the main elements of a wiring board manufacturing system, which is an electric wiring forming system of a first embodiment of the present invention, and an external view of the system as a whole. FIG. 3 is a block diagram of an electrical control block of a feeding unit constituting the above-mentioned wiring board manufacturing system. FIG. 4 is a block diagram of an electrical control block of a drawing die unit constituting the above-mentioned wiring board manufacturing system. FIG. 5 is a block diagram of an electrical control block of a stage unit constituting the above-mentioned wiring board manufacturing system. FIG. 6 is a block diagram of an electrical control block of the auxiliary unit constituting the above-mentioned wiring board manufacturing system. Further, FIG. 7 is a longitudinal cross-sectional view showing the mechanism parts of the above-mentioned feeding unit and drawing die unit. FIG. 8 is a perspective view showing the mechanism parts of a stage unit.

A wiring board manufacturing system 10 of this embodiment is a system for manufacturing an electric wiring board, and the above-mentioned electric wiring board is manufactured by plotting a wiring pattern while moving the board material side along a pattern while discharging a molten magnesium alloy.

The above-mentioned wiring board manufacturing system 10, as shown in FIGS. 1 and 2, comprises a controlling portion 1, which is mainly a controlling device that is in charge of controlling the entire system; a CAD (computer aided design) portion 5 for inputting wiring pattern data; a scanner portion 6 for reading a wiring pattern; a feeding unit 7 for melting magnesium alloy chips, which are the conductive metal, and feeding same as an alloy slurry; a drawing die 8 having a predetermined discharge opening diameter; a stage unit 9 of a moving stage, which has a stage (moving table) for mounting a board, and which drives and controls the above-mentioned stage; an auxiliary unit 100 comprising a die exchanging device, pin driving device, laser device and so forth; and a power control unit 11 for controlling the drivers of each unit.

Furthermore, the above-mentioned auxiliary unit 100 is a control unit, which is incorporated as an option, and a wiring board manufacturing system 10, which does not comprise the above-mentioned auxiliary unit 100, will be explained first as a main system.

In this wiring board manufacturing system (main system) 10, wiring pattern data by which a wiring pattern is formed on a board, is received by the controlling portion 1 via either the CAD portion 5 or the scanner 6.

A board material 16, which constitutes a work member, is mounted on the movable stage of the stage unit 9. In the meantime, magnesium alloy chips 15, which are the conductive metal, are loaded via a loading opening 21a of the feeding unit 7, which is supported in a fixed condition by a base 12.

The above-mentioned chips 15 are melted inside the feeding unit 7 into an alloy slurry of a certain thixotropic state (explained hereinbelow) of half-molten fluidity, and are discharged from the discharge opening of the drawing die unit 8.

The stage of the stage unit 9 is driven and controlled in accordance with wiring pattern data in a state which is synchronized with the discharge of the above-mentioned alloy slurry.

A wiring pattern 17 is plotted on the board material 16 in accordance with the movement of the stage of the above-mentioned stage unit 9, and an electric wiring board 16A is produced.

Furthermore, each of the above-mentioned units is controlled by a CPU 2 inside the controlling portion 1.

Hereinbelow, each of the above-mentioned units will be explained in detail. Furthermore, in the below explanation, the fore-aft movement direction of the stage unit 9 will be treated as the Y-axis (+, −) direction, the left-right movement direction will be treated as the X-axis (+, −) direction, and the up-down movement direction will be treated as the Z-axis (+, −) direction. As the skewed directions of the stage, a circular motion (tilting) angle around the above-mentioned Y-axis will be treated as θY, and a circular motion (tilting) angle around the above-mentioned X-axis will be treated as θX.

The above-mentioned controlling portion 1 comprises a CPU (central processing unit) 2 as an arithmetic and controlling portion, a keyboard 3, and a monitor 4. The above-mentioned controlling portion 1 controls each control unit on the basis of wiring pattern data inputted via either the CAD 5 or the scanner 6.

The above-mentioned feeding unit 7, as the electrical controlling portions thereof, comprises a screw rotating motor 25 for rotating and driving a screw shaft 22; a screw moving motor 26 for axially moving the above-mentioned screw shaft 22; a cylinder heater 27, which is disposed on the peripheral portion of a cylinder main body 21; a screw shaft rotation sensor 28 for detecting the rotation of the screw shaft; a screw shaft position sensor 29 for detecting the shaft position of the screw shaft; a cylinder temperature sensor 30 for detecting the temperature of the cylinder; a driver 31 for driving the above-mentioned screw rotating motor 25; a driver 32 for driving the above-mentioned screw moving motor 26, and a driver 33 for driving the cylinder heater 27, as shown in FIGS. 3 and 7.

Furthermore, as the mechanism parts of the above-mentioned feeding unit 7, this feeding unit 7 comprises a cylinder main body 21, which is supported in a fixed condition by a base 12; a screw shaft 22, which is rotatably and axially movably supported inside the cylinder main body 21; a rotational driving gear 23, which is slidably mounted on the screw shaft 22; and a backflow prevention ring 24, which is axially movably fitted to the inner wall of the cylinder main body, as shown in FIG. 7.

The above-mentioned cylinder main body 21 has a magnesium alloy chip 15 loading opening 21a, and an alloy slurry discharge opening 21b.

On the above-mentioned screw shaft 22, there are disposed a gear 22a for linear movement; a spline portion 22b, to which a rotational driving gear 23 is slidably mated; a screw portion 22c; a flange-shaped presser portion 22d, which is capable of direct contact with the above-mentioned backflow prevention ring 24; and a cone-shaped screw head portion 22e of the end portion.

The screw portion 22c rotates and moves axially together with the screw shaft 22 inside the above-mentioned cylinder main body 21, slurrying and downwardly transporting loaded magnesium alloy chips 15 while compressing and mixing same.

The above-mentioned drawing die unit 8, as the electrical controlling portions thereof, comprises an in-die (mold) heater 42, which is embedded in the die main body 41; an in-die cooler 43; a board cooler 45; a die temperature sensor 47 for measuring the temperature of the die; a die heater/cooler driver 48; and a board cooler driver 49, as shown in FIGS. 4 and 7.

In the above-mentioned in-die heater 42, there is employed a heater of an electromagnetic induction heating system, which is capable of prompt, localized heating.

The above-mentioned in-die cooler 43 is a feeding device of a cooling liquid, which is the cooling medium in a cooling tube 44 embedded inside the die, and is driven by the die heater/cooler driver 48.

The above-mentioned board cooler 45 is a device for blowing a cooling gas (inert gas or air), which is a cooling medium, into a plurality of board cooling blower tubes 46 embedded within the die, and is driven by the board cooler driver 49.

Furthermore, as the mechanism parts, the above-mentioned drawing die unit 8 comprises a die main body 41 having an alloy slurry discharge opening 41a; and a cooling tube 44 for cooling the die and a plurality of blower tubes 46 for cooling a board, all of which are embedded in the vicinity of the discharge opening of the die main body 41, as shown in FIG. 7. Furthermore, the above-mentioned blower tubes 46 comprise a plurality of tubes in a state, wherein each blowout opening 46a, 46b, 46c, . . . is equally spaced around the discharge opening 41a as shown in the plan view of the die main body of FIG. 9(A), and are embedded inside the die main body 41.

The above-mentioned stage unit 9 is a control stage capable of being driven along 5 axes.

As the electrical controlling portions, the above-mentioned stage unit 9 comprises a Y-axis motor 71, an X-axis motor 72, a Z-axis motor 73, a θY-axis motor 74 and a θX-axis motor 75 as the stage driving motors of each axial direction; a stage cooler 86 for sending a cooling liquid, which is the cooling medium, for cooling the work stage 55; a Y-axis position sensor 81, an X-axis position sensor 82, a Z-axis position sensor 83, a θY-axis position sensor 84, and a θX-axis position sensor 85, which are sensors for detecting the amount of movement of the stage; a stage temperature sensor 88 for detecting the temperature of the work stage 55; a driver 89 for each of the above-mentioned stage driving motors; and a stage cooling driver 90 for driving the above-mentioned stage cooler, as shown in FIGS. 5 and 8.

Furthermore, the above-mentioned Y-axis motor 71 is supported by a stage frame 50. The above-mentioned X-axis motor 72 is supported by the Y stage 51. The above-mentioned Z-axis motor 73 is supported by the X stage 52. The above-mentioned θY-axis motor 74 is supported by the Z stage 53. The above-mentioned θX-axis motor 75 is supported by the θY stage 54.

As the mechanism parts, the above-mentioned stage unit 9 comprises a stage 50 (see FIG. 2), which is fastened to a base 12, and movably supports these mechanism parts; and, as shown in FIG. 8, a Y stage 51, which is movably supported in the direction of the Y-axis by guide shafts 56; an X stage 52, which is movably supported in the direction of the X-axis by guide shafts 57; a Z stage 53, which is movably supported in the direction of the Z-axis by guide shafts 58; a θY stage 54, which is rotatably supported around the Y-axis by support shaft 59; a work stage 55, which enables board material 16 to be mounted; and, in addition, a Y-axis feed screw 61, which screws together with the Y stage 51; an X-axis feed screw 62, which screws together with the X stage 52; and a Z-axis feed screw 63, which screws together with the Z stage 53.

Furthermore, the above-mentioned guide shafts 56 are supported by the stage frame 50, and the above-mentioned guide shafts 57 are supported by the Y stage 51. Guide shafts 58 are supported by the X stage 52. Further, support shaft 59 is supported by the Z stage 53. Support shaft 60 is supported by the θY stage 54.

Further, a gear 61a, which meshes with a pinion 71a of the Y motor 71, is mounted in a fixed condition on the above-mentioned Y-axis feed screw 61, and when the Y motor 71 rotates, the Y stage 51 moves in the direction of the Y-axis.

A gear 62a, which meshes with a pinion 72a of the X motor 72, is mounted in a fixed condition on the above-mentioned X-axis feed screw 62, and when the X motor 72 rotates, the X stage 52 moves in the direction of the X-axis.

A gear 63a, which meshes with a pinion 73a of the Z motor 73, is mounted in a fixed condition on the above-mentioned Z-axis feed screw 63, and when the Z motor 73 rotates, the Z stage 53 moves in the direction of the Z-axis.

A gear 54a, which meshes with a pinion 74a of the θY motor 74, is mounted in a fixed condition on the above-mentioned θY stage 54, and when the θY motor 74 rotates, the θY stage 54 rotates (tilts) in the θY direction.

The above-mentioned work stage 55 is the θX stage, which is circularly movably supported around the X-axis by support shaft 60. And a gear 55a, which meshes with a pinion 75a of the θX motor 75, is mounted in a fixed condition on the above-mentioned work stage 55, and when the θX motor 75 rotates, the work stage 55, which is the θX stage, moves in a circular motion (tilts) in the θX direction.

Further, a cooling tube 87, through which a cooling liquid passes, is embedded in the above-mentioned work stage 55 (see FIG. 7).

In the above-mentioned stage unit 9, the Y motor 71, X motor 72, Z motor 73, θY motor 74 and θX motor 75, which are the stage driving motors, are each independently drivable by a driver 89, and moving and tilting in each axial direction of each stage 51, 52, 53, 54 is synthesized, and the work stage 55 is ultimately either moved or tilted in a composite direction.

Furthermore, the auxiliary unit 100 is a control unit, which is optionally incorporated, and will be explained hereinbelow using the block diagram of FIG. 6.

A wiring pattern forming operation of a wiring board according to a wiring board manufacturing system (main system) 10 of the first embodiment, constituted as described hereinabove, will be explained hereinbelow.

Prior to manufacturing a wiring board 16A, wiring pattern shape data is received by the CPU 2 via either the CAD 5 or the scanner 6. Further, data concerning the type of board material, such as whether this material is a flat, hard board, a curved board, or a flexible printed board, and also data concerning the thickness of the board material 16, and the thickness of the conductive metallic foil of a wiring pattern 17 are inputted to the CPU 2 via a keyboard 3.

The CPU 2 determines in accordance with arithmetic computations driving locus data related to the 5 axes of the stage unit 9 based on the above-mentioned wiring pattern shape data.

Furthermore, the size of the discharge opening 41a of the drawing die unit 8 is set in accordance with the minimum line width of the above-mentioned wiring pattern, and the drawing die unit 8 to be mounted is selected.

Furthermore, the initial position and attitude of the stage unit 9 is set in accordance with the type and thickness data of the above-mentioned board. For example, in a case in which the board material 16 is an ordinary flat board, the inclination of the work stage 55 in the θY and θX directions is set so as to be horizontal. Further, the clearance between the bottom surface of the drawing die unit 8 and the board material 16 on the work stage 55 is set in accordance with the thickness of the board material 16 and the desired thickness of the foil of the wiring pattern by driving the work stage 55 in the Z direction.

The alloy chips 15 for generating a wiring pattern constitute a magnesium-based aluminum alloy capable of forming a thixotropic state, which will be explained hereinbelow, at a low temperature. In addition, magnesium, aluminum, or an aluminum alloy or other such conductive metal can also be used, and the temperature settings of the cylinder heater 27 and in-die heater 42 are established corresponding to the characteristics of the conductive metal thereof.

After completing the above-mentioned initial settings, a board material 16 is mounted on the work stage 55. And then, magnesium alloy chips 15 are loaded via the loading opening 21a of the feeding unit 7 together with an inert gas, and the screw shaft 22 begins to rotate and move (the screw shaft 22 moves upwardly). The above-mentioned alloy chips 15 are sent downward while being mixed and compressed by the screw portion 22c, and are heated by the cylinder heater 27 to approximately 550° C. at which a thixotropic state, which will be explained hereinbelow, is ultimately achieved.

The above-mentioned alloy chips 15 constitute a state in which a solid phase and a liquid phase of a dendrite state are mixed together by heating and mixing action in the initial transport state. In this state, viscosity is still high. Furthermore, when transported downwardly in the cylinder, heated, mixed and compressed, the alloy chips 15 change into an alloy slurry 15A of a thixotropic state in which the solid phase parts in the liquid phase are granulated to around 10 microns. In this state, viscosity decreases, and fluidity increases.

The screw shaft 22 is extracted, and when the screw shaft 22 is rotated, an alloy slurry 15A, in which alloy chips 15 are plasticized and made into a slurry of a thixotropic state, passes through the backflow prevention ring 24 and accumulates in a slurry well 21c below the screw head 22e.

After a predetermined amount of alloy slurry 15A has collected in the slurry well 21c, the screw shaft 22 once again switches to a downward stroke. During the downward stroke, the alloy slurry 15A in the slurry well 21c is discharged by the screw head 22e at a predetermined rate from the discharge opening 21b to the drawing die unit 8 side. During the stroke thereof, because the backflow prevention ring 24 makes direct contact with the presser portion 22d of the screw shaft 22, the alloy slurry 15A does not reverse flow upwards, and an amount corresponding to the stroke quantity is discharged.

The alloy slurry 15A that flows into the drawing die unit 8 is discharged from the discharge opening 41a onto a board 16. The movement of the stage unit 9 is controlled in the X, Y directions in synchronization with the discharge of the alloy slurry 15A thereof, a wiring pattern 17 is formed on a board 16, and a wiring board 16A is completed.

Furthermore, in order to prevent a decrease in fluidity resulting from a temperature reduction of the alloy slurry 15A on the inside of the die main body 41 of the above-mentioned drawing die unit 8, a predetermined temperature is maintained by heating the alloy slurry 15A via an in-die heater 42. Since the in-die heater 42 is an electromagnetic induction heating heater, quick response and localized high-temperature heating are possible, and the alloy slurry 15A is maintained at the proper temperature at all times, even at discharge stoppage.

When the pattern width data of the above-mentioned wiring pattern 17 is wider than the discharge opening 41a of the above-mentioned drawing die unit 8, either the desired pattern width is achieved by moving the work stage 55 back and forth while moving same sideways, or the drawing die unit 8 is replaced with another drawing die unit having a different discharge opening diameter, and a wiring pattern is generated once again. Or, either a change-over drawing die or an adjustable drawing die of the auxiliary unit, which will be explained hereinbelow, can be used.

The traveling speed of the work stage 55 when the alloy slurry 15A is discharged onto the above-mentioned board and a pattern is formed (X-axis, Y-axis composite speed) is established in conjunction with the exit velocity of the alloy slurry 15A and the foil thickness of the wiring pattern such that the desired wiring pattern thickness (foil thickness) is obtained.

Furthermore, the traveling speed of the above-mentioned work stage 55 must also be set to a traveling speed that is slower than the solidification time to prevent the runoff of the discharged alloy slurry 15A. Based on simulations, a traveling speed of less than around 200 m/S is required.

The alloy slurry 15A discharged onto a board 16, after forming (printing) a wiring pattern 17, slowly hardens, but because the alloy slurry 15A thereof has a magnesium base, this alloy slurry is susceptible to oxidation. Further, because the alloy slurry 15A is a high temperature, there is also the possibility of the occurrence of thermal degradation, such as the carbonization of the board 16.

Accordingly, to prevent the above-mentioned oxidation, and to prevent the thermal degradation of the board 16, this system 10 is constituted such that a cooling gas is sprayed from a blowout opening of the blower tube 46 of the drawing die unit 8 onto the wiring pattern 17 immediately after printing, rapidly cooling the above-mentioned wiring patterned alloy.

Furthermore, the cooling gas blown through the above-mentioned blower tube 46 is supplied from the board cooler 45. Further, the above-mentioned inert gas, or air is used, but if chromic acid or manganic acid, which are magnesium anticorrosive agents, is added to the above-mentioned inert gas or air, the need to perform an anticorrosive treatment after wiring pattern completion is eliminated, and a number of treatment processes can be omitted.

Figure 9A:
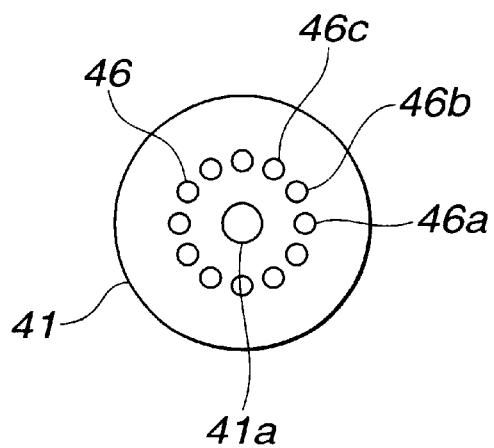
FIG. 9(A) is a diagram showing the layout of the ventilation pipes of the main body of the die of the drawing die unit constituting the above-mentioned wiring board manufacturing system of the first embodiment of FIG. 1, and is a plan view of the main body of the die.

As for the above-mentioned blower tube 46, a plurality of tubes is provided, and as described hereinabove, blowout openings 46a, 46b, 46c, . . . are arranged equidistantly around the discharge opening 41a of the die main body 41 (see FIG. 9(A)).

Figure 9B:
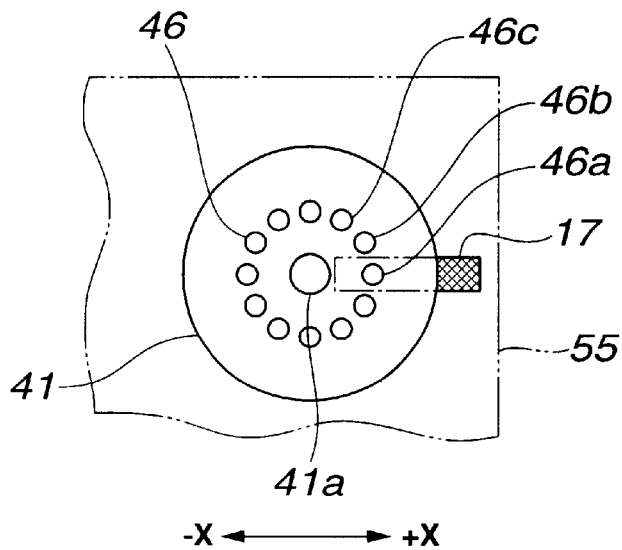
FIG. 9(B) is a diagram showing the layout of the ventilation pipes of the main body of the die of the drawing die unit constituting the above-mentioned wiring board manufacturing system of the first embodiment of FIG. 1, and is a plan view of the main body of the die in a wiring pattern forming state.

The blower tubes 46 correspond to the direction of travel of the work stage 55, and the above-mentioned blowout opening of a blower tube, which is on the opposite side of the direction of travel, is selected and cooling gas is blown out. For example, as shown in FIG. 9(B), in a state, wherein the work stage 55 is moving in the −X direction and a wiring pattern 17 is in the process of being printed in the +X direction, cooling gas is blown out through the blower tube 46 connected to blowout opening 46a, which is located on the +X direction side.

Furthermore, a board 16 is cooled by passing a cooling liquid supplied from the stage cooler 86 through a cooling tube 87 provided in the work stage 55, enabling the rate of cooling of a wiring pattern immediately following printing to be further accelerated.

When the printing of a continuous wiring pattern 17 in accordance with the continuous discharge of an alloy slurry 15A is complete, the outflow of alloy slurry 15A from the discharge opening 41a in the drawing die unit 8 must be stopped. Thus, a cooling liquid supplied from the in-die cooler 43 is made to flow through a cooling tube 44 of the die main body 41, the vicinity of the discharge opening 41a is cooled, and a closed state is created by making the alloy slurry 15A into a semi-solid state.

Thereafter, when printing is to resume of a separate wiring pattern, the heating of the die main body 41 commences in accordance with the in-die heater 42, the alloy slurry 15A inside the die is converted to a fluid state, the alloy of the above-mentioned discharge opening 41a is melted simultaneously, the discharge opening 41a is set to an open state, and wiring pattern printing resumes.

In wiring pattern forming with the above-mentioned alloy slurry 15A, when it is desirable to print the wiring pattern thickness (foil thickness) more thickly, the temperature of the die main body 41 of the drawing die unit 8 is lowered by controlling the in-die heater 42 and the in-die cooler 43, enabling pattern thickness to be increased by increasing the viscosity of the alloy slurry 15A.

Furthermore, the electrical resistance value of the wiring pattern itself can be changed by adjusting the above-mentioned pattern thickness. Further, it is also possible to utilize the parts where pattern thickness has been increased as either positioning or electrical connection parts of an electrical member mounted on a board.

Furthermore, when the pattern thickness is changed as described hereinabove, it is necessary to adjust the clearance of the board 16 between the work stage 55 and the bottom surface of the die main body of the drawing die unit 8 by controlling the position of the stage unit 9 in the Z direction.

Figure 10:
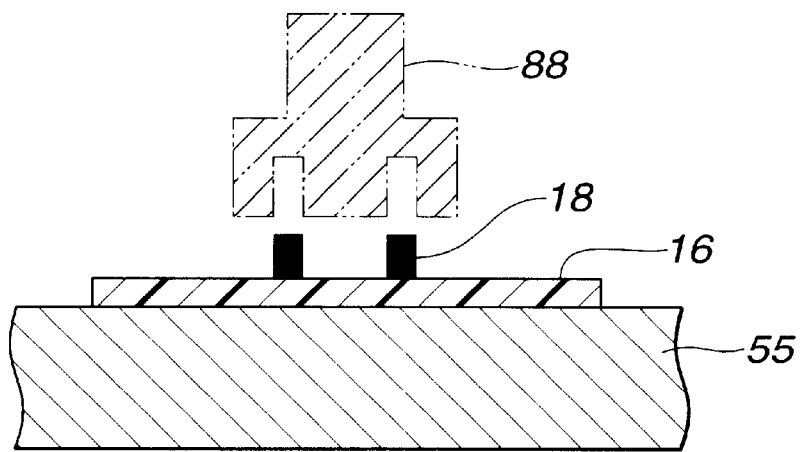
FIG. 10 is a cross-sectional view, of a board, showing a state, wherein a wiring pattern is provided on a board as a connector contactor in the above-mentioned wiring board manufacturing system of the first embodiment of FIG. 1.

Furthermore, by increasing the viscosity of the alloy slurry 15A, it is possible to partially build the alloy slurry 15A up higher as in the wiring pattern 18 shown in the cross-sectional view of a board of FIG. 10, thus enabling the wiring pattern 18 part thereof to be used as a contactor of a connector 88.

Figure 11:
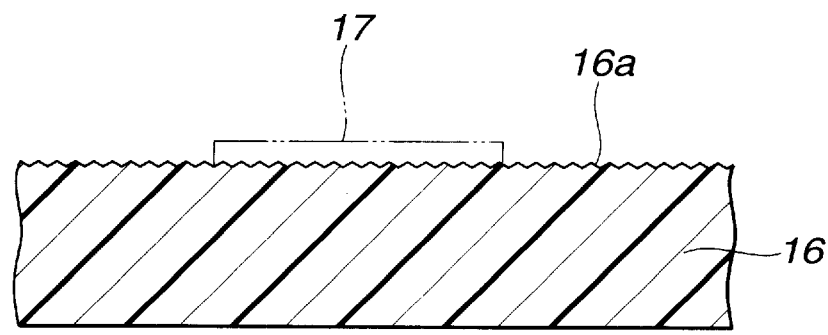
FIG. 11 is an enlarged cross-sectional view showing the surface state of a board in the above-mentioned wiring board manufacturing system of the first embodiment of FIG. 1.

A wiring pattern 17 formed by the above-mentioned alloy slurry 15A must not readily peel away from a board 16. Thus, as shown in the expanded cross-sectional view of a board of FIG. 11, the surface of the board 16 retains a rough surface 16a of micro-pitch bumps in accordance with either mechanical or chemical surface treatment. By making the surface rough like this, it is possible to generate an anchoring effect, thus making the above-mentioned wiring pattern 17 difficult to peel off.

As the above-mentioned board material 16, a board made of polyimide resin (PI) or polyethyl ether ketone resin (PEEK), which are super engineering plastics that are degraded little by the heat of the alloy slurry 15A, can be used, or paraphenylene benzobis oxazole resin (PBO) or aramid resin, which are heat-resistant fiber resins, can be used. By using these resins, it is possible to prevent deformation or carbonization resulting from the heat of a discharged alloy slurry 15A.

In the system 10 of this embodiment, the stage unit 9 can be driven and controlled along 5 axes as described hereinabove, and in addition to the X, Y axes, is capable of Z axis, as well as circular motion, drive in the θX and θY directions. Therefore, according to this system, wiring pattern forming is not limited to the above-mentioned flat board 16, but rather is also possible on a three-dimensional curved board.

Figure 12:
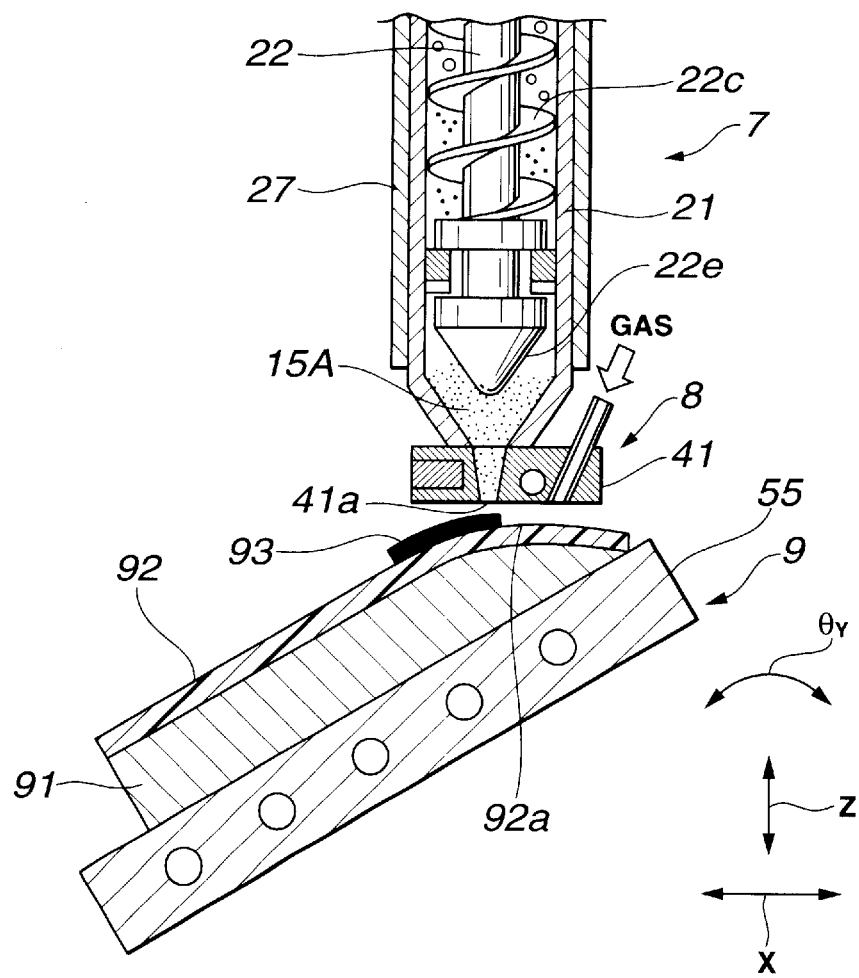
FIG. 12 is a longitudinal cross-sectional view showing a state for forming a wiring pattern on a board having a curved surface portion using the above-mentioned wiring board manufacturing system of the first embodiment of FIG. 1.

FIG. 12 is a longitudinal cross-sectional view showing a state, wherein a wiring pattern is being formed on a board having a curved portion by using the wiring board manufacturing system 10 of this first embodiment.

The board 92 being used is a flexible printed board, and is mounted in a fixed condition on another curved surface member 91.

When a three-dimensional wiring pattern 93 is to be formed on the curved surface part 92a of the above-mentioned board 92, the stage unit 9 is driven in the Z-axis position, X-axis position or Y-axis position, and the θY circular motion angle or the θX circular motion angle such that the pattern forming part of the above-mentioned curved surface portion 92a is positioned parallel to, and with a predetermined clearance below, the discharge opening 41a of the die main body 41, holding the work stage 55 in an inclined state.

In the above-mentioned work stage setting state, the discharge of alloy slurry 15A commences from the drawing die unit 8. During pattern forming, the Z-axis position, X-axis position or Y-axis position, and the θY circular motion angle or the θX circular motion angle of the stage unit 9 must be constantly driven and controlled such that the pattern forming surface is always positioned in a parallel state below the discharge opening 41a of the die main body 41. By so doing, it is possible to form a wiring pattern 93 on the curved surface part 92a of a board 92.

According to the wiring board manufacturing system (main system) 10 of the first embodiment described hereinabove, excluding the hereinbelow explained auxiliary unit 100, environmental pollution problems resulting from waste liquids do not occur as they do with wiring board manufacturing methods in accordance with conventional etching.

Further, because it is possible for wiring pattern data to be inputted via a scanner or CAD, time is no longer required for the preparation of a mask, and so forth, making it possible to manufacture a wiring board in a short period of time. Therefore, this system is extremely effective as a wiring board manufacturing system for small lot production and for research and development work, in which lots are small and delivery times are short.

Further, in this main system 10, since the constitution used is such that the cylinder side, which discharges the conductive metal when forming a wiring pattern on a board, is affixed to a base, and the board side is mounted on a movable stage, the above-mentioned cylinder support structure is simple, and is also easy to inspect and maintain, and the system also occupies little space. Further, because a board is simply mounted on a stage unit, positioning control is carried out in a small load state, and a wiring pattern is also accurately formed on the board. Furthermore, the stage unit itself can also be constituted as a smaller scale control system.

Further, by using a magnesium alloy as the conductive metal for forming a wiring pattern, and also providing a screw portion for mixing action inside the heating cylinder, it is possible to achieve a thixotropic state, which has good fluidity, on the basis of a lower temperature state, and the forming of a wiring pattern can be easily accomplished.

Further, in this main system 10, a board material constituting work is mounted onto a stage unit, which is capable of being driven and controlled along the 5 axes X, Y, Z, θY, θX, and the board thereof is positioned and controlled in the direction of the above-mentioned 5 axes as needed. Therefore, alloy slurry discharged from the above-mentioned cylinder is printed along a pattern locus, making it possible to manufacture two-dimensional boards, as well as wiring boards having a three-dimensional surface in a short period of time. Furthermore, if a system handles only two-dimensional flat boards, then of course there is no need for the drive controlling portions of the θX-axis and θY-axis.

Further, a wiring board 16A, which is manufactured by this main system 10, can thereafter be placed in an annealing furnace and subjected to annealing, thereby relieving the stress generated between the board and the discharged alloy for forming the pattern. In accordance with the stress relief thereof, it is possible to prevent accidents occurring, such as the breaking of a wiring pattern, even when a wiring board 16A is subjected to a harsh environment. Furthermore, the above-mentioned annealing furnace can either be arranged by connecting same to the main system 10, or can be installed in a different location.

Next, the constitution and operation of an auxiliary unit 100 as optional equipment capable of being incorporated into a wiring board manufacturing system (main system) 10 of the above-mentioned first embodiment will be explained.

The above-mentioned auxiliary unit 100 comprises a drawing die exchanging device 101 like that shown in the block diagram of the electrical controlling portions of FIG. 6, and a drawing die exchange driver 102 for driving a drawing die exchanging device; a through-hole device 103; a vacuum device 108, and a vacuum driver 109 for driving the above-mentioned vacuum device; a laser device 110, and a laser driver 111 for driving the above-mentioned laser device; a take-up device 112, and a take-up driver 113 for driving the above-mentioned take-up device; an end mill device 114, and an end mill driver 115 for driving the above-mentioned end mill device; a solder bonding device 116, and a solder bonding driver 117 for driving the above-mentioned solder bonding device; a defect inspecting device 118, and a defect inspection driver 119 for driving the above-mentioned defect inspecting device; a board inverting device 120, and a board inversion driver 121 for driving the above-mentioned board inverting device; and a dispenser 122, and a dispenser driver 123 for driving the above-mentioned dispenser.

The drawing die exchanging device 101 constituting the above-mentioned auxiliary unit 100 is a device, which is mounted in place of the drawing die unit 8 described hereinabove (see FIG. 7), and is a device, which enables the automated switching of the alloy slurry 15A discharge opening diameter (drawing diameter). By switching the above-mentioned discharge opening diameter, it is possible to change the line width of a wiring pattern.

Figure 13:
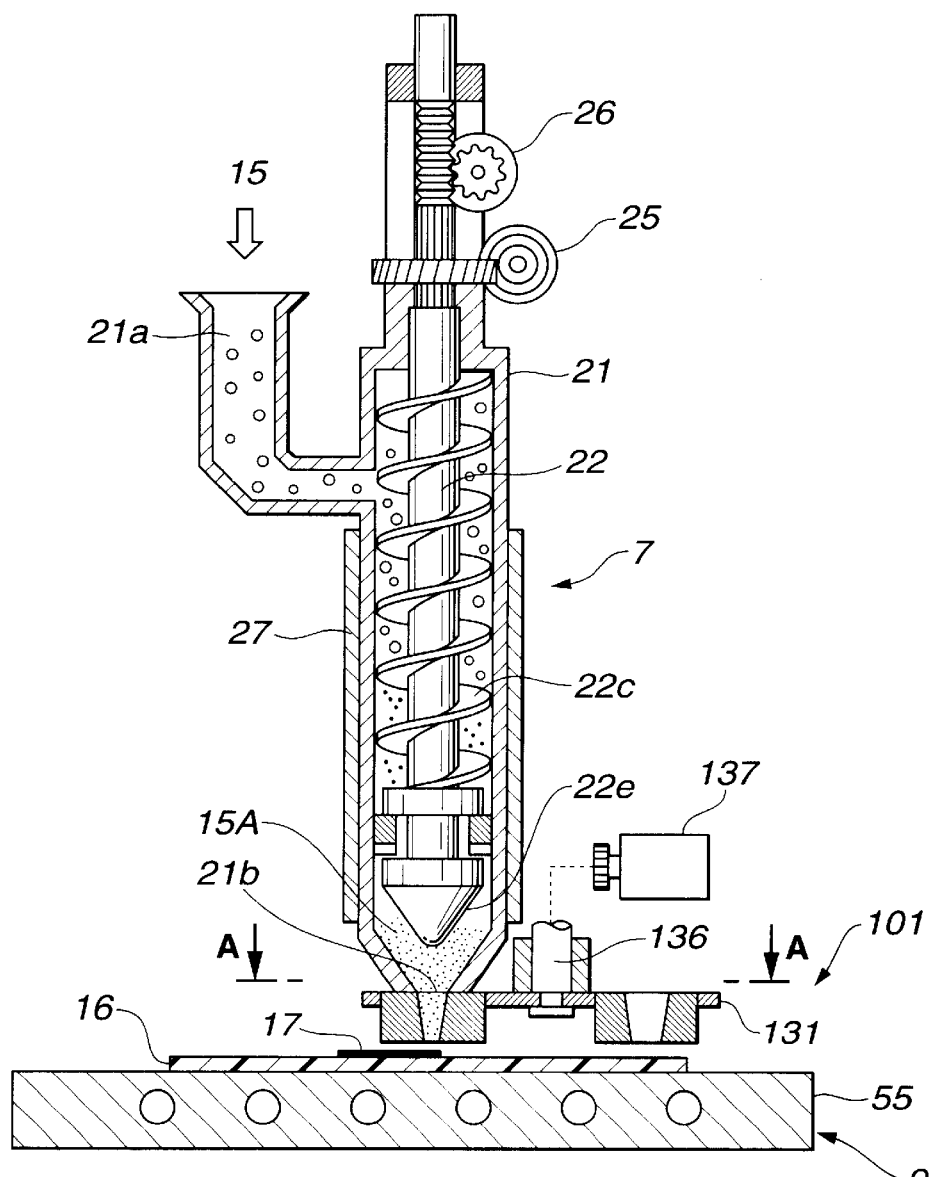
FIG. 13 is a longitudinal cross-sectional view showing a state, wherein a drawing die exchanging device from the auxiliary unit incorporated in the above-mentioned wiring board manufacturing system of the first embodiment of FIG. 1 is mounted on a cylinder unit.
Figure 14:
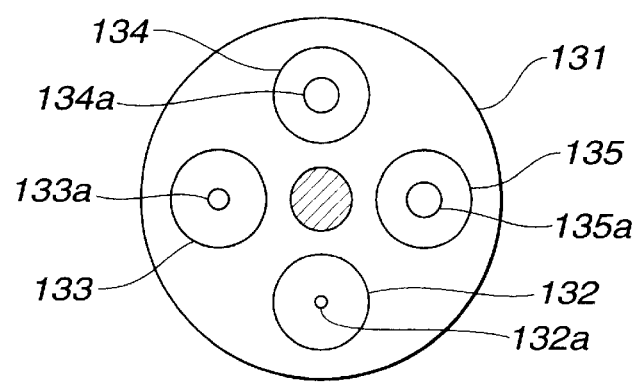
FIG. 14 is a cross-sectional view through A—A of FIG. 13.

FIG. 13 is a longitudinal cross-sectional view showing a state in which the above-mentioned drawing die exchanging device is mounted on a cylinder unit 7, and FIG. 14 is a cross-sectional view through A—A of FIG. 13, and shows a plan view of the die main body of this drawing die exchanging device 101. However, cylinder 21 is not shown in FIG. 14.

The above-mentioned drawing die exchanging device 101 comprises a turntable-type die main body 131, which is mounted on the alloy slurry discharge side of the cylinder main body 21 of the feeding unit 7; four drawing members 132, 133, 134, 135 mounted in a fixed condition on the die main body; a supporting shaft 136 of the die main body 131, which is supported in a freely rotating condition by a base 12 (see FIG. 2); a die exchange drive motor 137 for rotating and driving the supporting shaft 136 via a sequence of gears; and an in-die heater and cooling tube not shown in the figure.

Each of circular discharge openings 132a, 133a, 134a, 135a is disposed in the center portion of the above-mentioned respective drawing members 132, 133, 134, 135. The diameters of the circular discharge openings thereof are set such that the diameter of discharge opening 132a is the smallest, and successively becomes larger from discharge opening 133a to discharge opening 135a.

When the printing of a wiring pattern is performed using the above-mentioned drawing die exchanging device 101, the stage unit 9 is driven and controlled in accordance with wiring pattern locus data in the same way as in the case of the above-mentioned main system 10, and a wiring pattern 17 is formed on a board 16.

Line width data is also included in the above-mentioned wiring pattern data. Therefore, when the line width data changes during formation of a wiring pattern, the system is stopped once, the die exchange drive motor 137 is driven, and the one of the above-mentioned four discharge openings 132a, 133a, 134a, 135a on the drawing die main body 131 that corresponds to the above-mentioned line width is selected. And then, wiring pattern printing is performed by discharging alloy slurry 15A from the selected discharge opening.

When this drawing die exchanging device 101 is used, it is also possible to deal with a wiring pattern in which the pattern width is changing by automatically switching line widths, making it possible to handle various wiring boards. Further, there are also fewer wiring pattern design restrictions.

Figure 15:
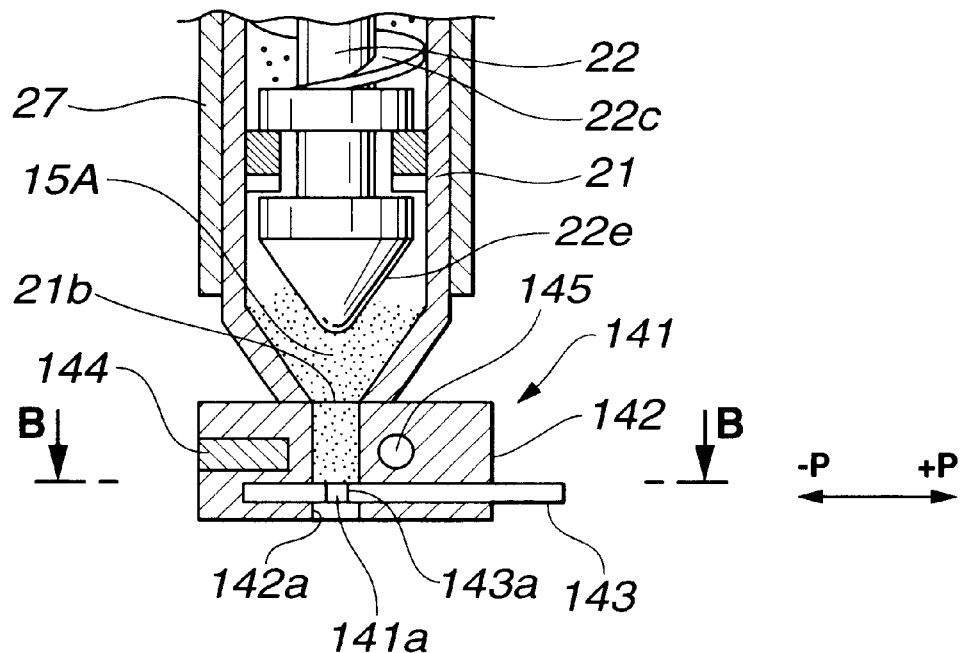
FIG. 15 is longitudinal cross-sectional view of the vicinity of an adjustable-type drawing die device as a variation of the above-mentioned drawing die exchanging device of FIG. 13.
Figure 16:
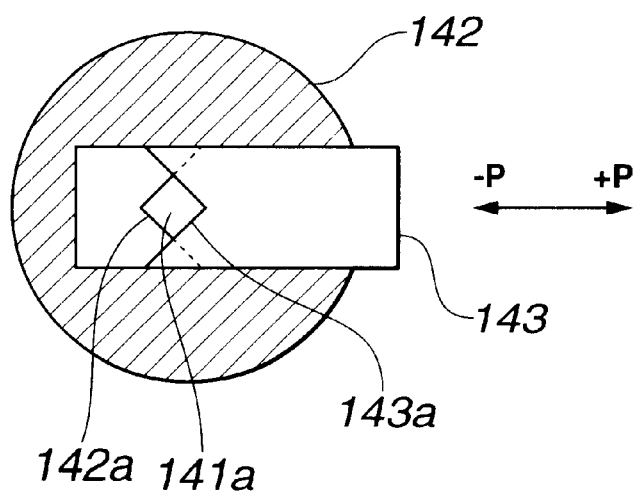
FIG. 16 is a cross-sectional view through B—B of the above-mentioned FIG. 15.

Furthermore, as a device of a modified example of the above-mentioned drawing die exchanging device 101, it is possible to propose an adjustable drawing die device 141 of a continuously variable aperture discharge opening, which is shown in FIG. 15. Furthermore, FIG. 16 is a cross-sectional view through B—B of FIG. 15.

The above-mentioned adjustable drawing die device 141 of FIG. 15 comprises a die main body 142, which is mounted on the alloy slurry discharge side of the cylinder main body 21 of the feeding unit 7; a sliding plate 143, which is supported in a slidable condition by the die main body; an in-die heater 144 and a cooling tube 145; and a sliding plate drive motor not shown in the figure.

In the above-mentioned die main body 142, a slide groove and notch 142a are disposed in the central bottom portion, and in the above-mentioned sliding plate 143, a notch 143a is disposed in the end portion. The above-mentioned notches 142a and 143a are positioned opposite one another, and form the discharge opening portion 141a. The aperture dimensions of the discharge opening portion 141a thereof can be adjusted by sliding the sliding plate 143 in the +, −P directions.

When printing of a wiring pattern is performed using the above-mentioned adjustable drawing die device 141 as well, the stage unit 9 is driven and controlled in accordance with wiring pattern data, and a wiring pattern 17 is formed on a board 16 just like with the above-mentioned wiring board manufacturing system 10.

When the pattern line width changes part way through the forming of the above-mentioned pattern, the sliding plate 143 is driven in the P direction, and set at a discharge opening portion 141a of a size corresponding to the above-mentioned line width. The wiring pattern forming operation does not necessarily have to be stopped at this time. And then, an alloy slurry 15A is discharged from the set discharge opening portion 141a, and wiring pattern printing is performed.

When this adjustable drawing die device 141 is used, the line width in particular can continuously be changed, and patterns of various shapes can be dealt with rapidly. Further, the size of the die main body is small, the space occupied by the drawing die exchanging device becomes smaller, and the area around the drawing die device can be made compact.

In the above-mentioned adjustable drawing die device 141, the discharge opening portion 141a was formed by notches on two members, but if the constitution were such that the above-mentioned discharge opening portion was formed by combining a plurality of three or more blades like in a camera diaphragm device, the above-mentioned discharge opening portion would become more nearly circular, and accurate pattern width changes would become possible.

Furthermore, in adjusting wiring pattern width, it is also possible to adjust the above-mentioned wiring pattern width by adjusting the temperature setting value or the discharge pressure setting value of the alloy slurry discharge opening without using the movable drawing members of the above-mentioned drawing die exchanging device 101 or the above-mentioned adjustable drawing die device 141.

Next, a through-hole device 103 constituting the above-mentioned auxiliary unit 100 will be explained.

Figure 17:
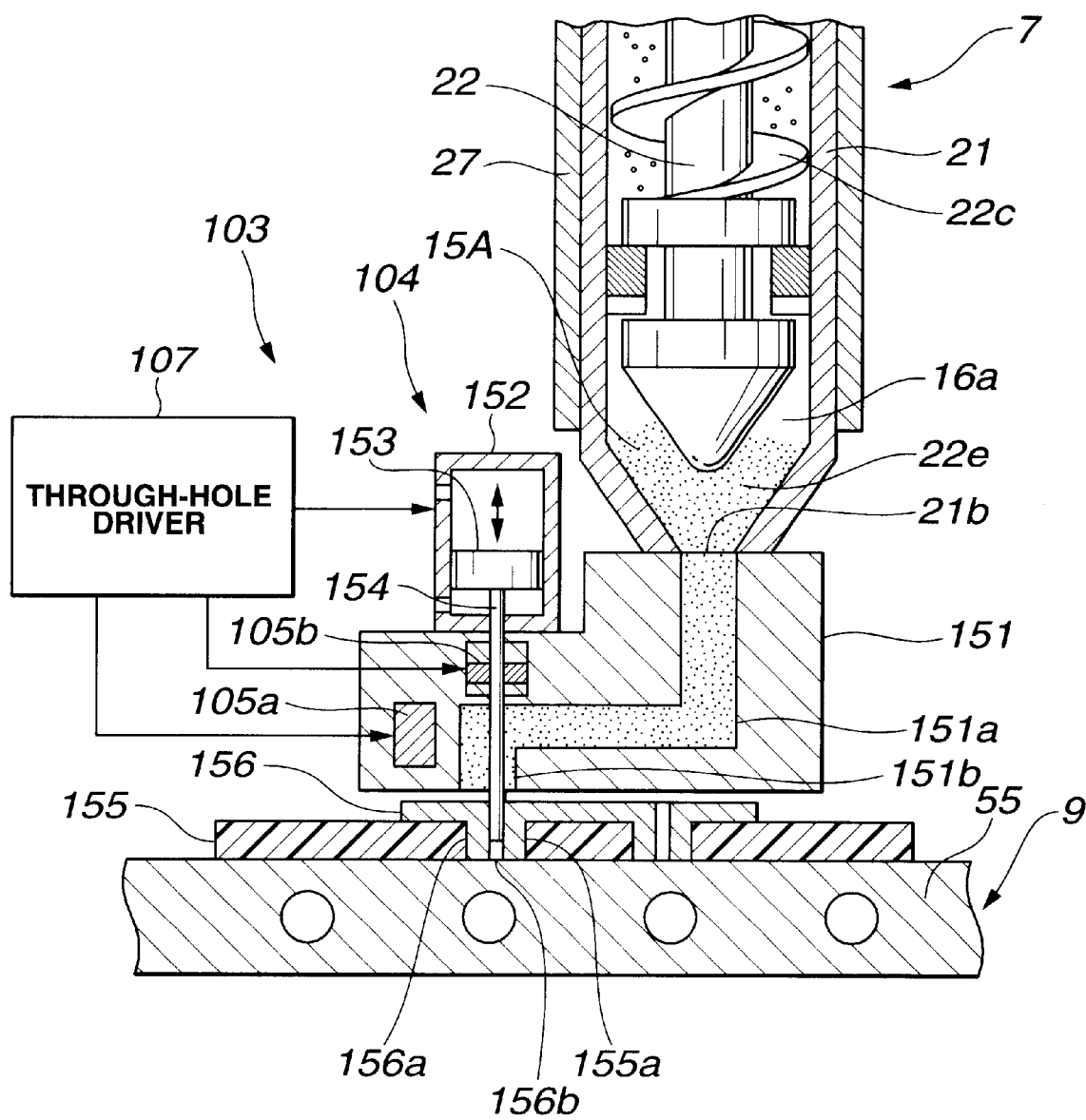
FIG. 17 is a longitudinal cross-sectional view of the main components of a through-hole device from the auxiliary unit incorporated in the above-mentioned wiring board manufacturing system of the first embodiment of FIG. 1.

This device 103, as shown in the block diagram of FIG. 6, and the longitudinal cross-sectional view of the main components of this through-hole device of FIG. 17, comprises a die main body 151; an in-die pin driving device 104 for driving a through-hole pin 154 back and forth; an electromagnetic induction heating-type in-die heater 105a for heating an alloy slurry and a pin-heating in-die pin heater 105b, which is attached to the through-hole pin 154; an in-die temperature sensor 106a; a pin temperature sensor 106b; and a driver 107 for driving this through-hole device.

The above-mentioned die main body 151 is disposed at the bottom portion of the cylinder main body 21, and has an approximately L-shaped slurry linking passage 151a for linking to the slurry discharge opening 21b of the cylinder main body 21; and a slurry discharge opening 151b through the center portion of which passes the through-hole pin 154. Further, the above-mentioned heaters 105a and 105b are built into the inside of the above-mentioned die main body 151, and furthermore, the in-die pin driving device 104 is mounted on the top portion.

The above-mentioned in-die pin driving device 104 has an air cylinder portion comprising a cylinder 152 and a piston 153, the through-hole pin 154 is mounted on the above-mentioned piston 153, and the in-die heater 105b for pin heating is attached to the through-hole pin 154.

When through-hole processing is performed on a board 155 using this through-hole device 103, alloy slurry 15A is injected from the slurry discharge opening 151b into a prepared through-hole 155a drilled in the board 155 beforehand. Thereafter, the above-mentioned in-die pin driving device 104 is driven, and the through-hole pin 154 is made to pass through the center of either a fluid state or a semi-hardened state injected alloy 156a inside the above-mentioned prepared hole 155a. And then, when the above-mentioned through-hole pin 154 is extracted while the above-mentioned injected alloy 156a is in a semi-hardened state, a through-hole 156b is formed on the board 155.

According to the above-mentioned through-hole device 103, through-hole processing can be performed when forming a pattern, and the through-hole board manufacturing process can be simplified. Further, a through-hole is formed by maintaining as-is a state in which an alloy has been injected into a prepared hole 155a, and passing a through-hole pin through the injected alloy 156a. Therefore, alignment with the through-hole prepared hole, when forming a through-hole, is not required.

Further, because the extraction of the through-hole pin 154 is carried out at such a time when the injected alloy 156a is in a semi-hardened state wherein there is little contraction, through-hole pin extraction can be performed easily.

Further, by maintaining the through-hole pin 154 at the proper temperature in accordance with the above-mentioned pin-heating in-die pin heater 105b, the temperature of the boundary between the above-mentioned pin and alloy can be maintained at the optimum temperature, further facilitating the extraction of the above-mentioned pin 154, and making it possible to form a good through-hole 156b.

Further, if a drilling device is arranged juxtaposed to the above-mentioned through-hole device 103, then the drilling of a through-hole prepared hole 155a and through-hole processing can be performed simultaneously, enabling efficient through-hole forming processing. Furthermore, if a solder bonding device is juxtaposed to the above-mentioned through-hole device 103, and if solder is injected into a through-hole prepared hole of a board, and the above-mentioned through-hole pin 154 is passed through and extracted therefrom, through-hole forming can be accomplished using solder.

Next, a vacuum device 108 constituting the above-mentioned auxiliary unit 100 will be explained.

Figure 18:
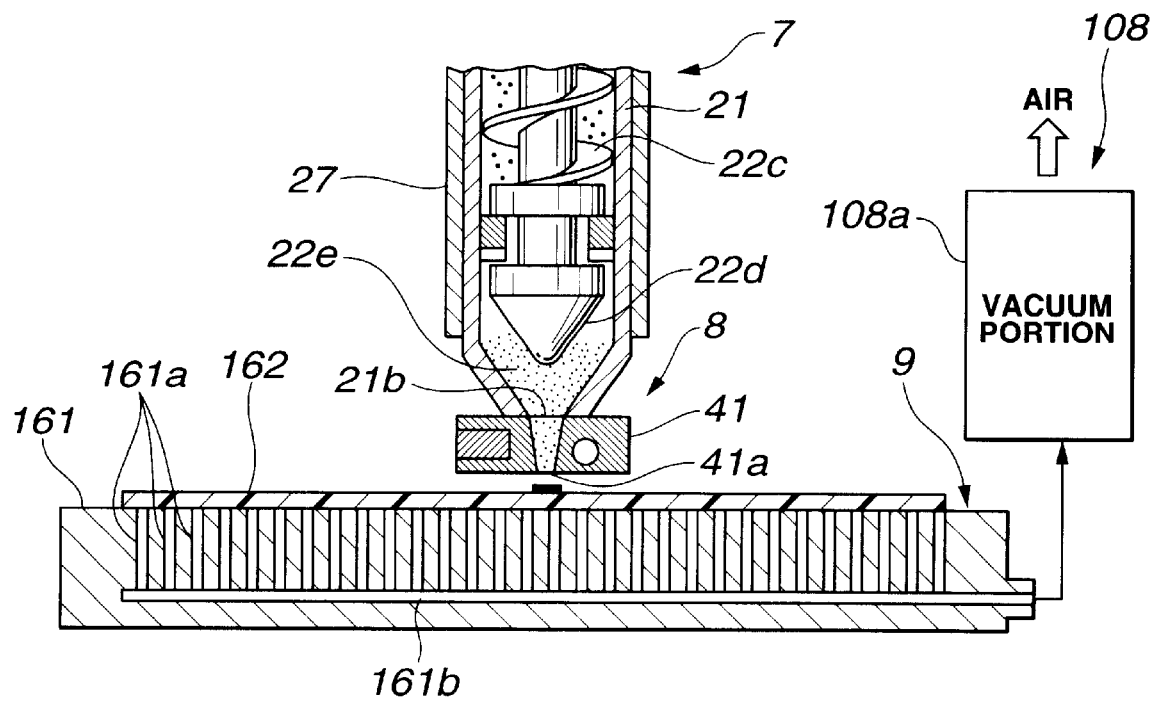
FIG. 18 is a longitudinal cross-sectional view of the main components of a vacuum device from the auxiliary unit incorporated in the above-mentioned wiring board manufacturing system of the first embodiment.

This vacuum device 108, as shown in the block diagram of FIG. 6, and the longitudinal cross-sectional view of the main components of this vacuum device of FIG. 18, comprises a vacuum work stage 161 and a vacuum portion 108a having a vacuum pump.

The above-mentioned vacuum work stage 161 is a work stage mounted in place of the above-mentioned work stage 55, and comprises a plurality of small openings 161a disposed on the board 162 mounting surface, and linking holes 161b for linking the above-mentioned openings 161a.

The above-mentioned vacuum portion 108a draws in air from the openings 161a via the above-mentioned linking holes 161b, firmly holding a board 162 mounted on the vacuum work stage 161. By mounting a board 162 in a fixed condition in this way, a predetermined clearance is established between the discharge opening 41a of the drawing die and the surface of a board, and the occurrence of wiring pattern slippage is prevented. Further, when the board being handled is a flexible board, good flatness is maintained.

Further, if the above-mentioned vacuum device 108 is used in combination with the above-mentioned through-hole device 103, air bleeding can be carried out when passing the through-hole pin 154 through the injected alloy 156a, enabling the forming of an even better through-hole.

Figures 19A, 19B, 19C:
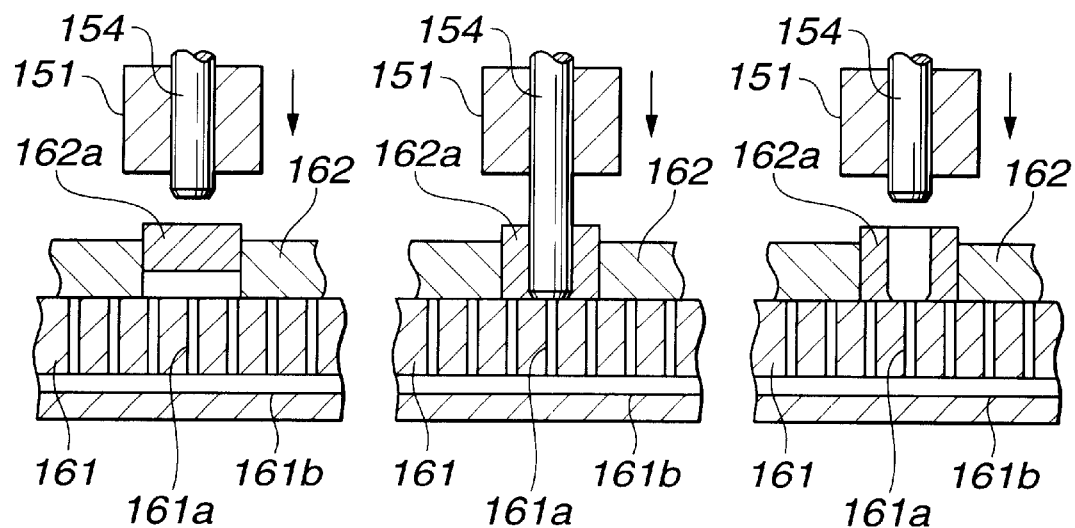
FIG. 19(A) is a partial longitudinal cross-sectional view of when the above-mentioned vacuum device of FIG. 18 is utilized as an air bleeder during through-hole formation with the above-mentioned through-hole device of FIG. 17, and shows a state, wherein an alloy has been injected into the prepared hole portion of a board through-hole.
FIG. 19(B) is a partial longitudinal cross-sectional view of when the above-mentioned vacuum device of FIG. 18 is utilized as an air bleeder at through-hole formation with the above-mentioned through-hole device of FIG. 17, and shows a state, wherein the through-hole pin has been made to pass through the injected alloy.
FIG. 19(C) is a partial longitudinal cross-sectional view of when the above-mentioned vacuum device of FIG. 18 is utilized as an air bleeder at through-hole formation with the above-mentioned through-hole device of FIG. 17, and shows a state, wherein the through-hole pin has been extracted.

FIGS. 19(A), (B) and (C) are partial cross-sectional views showing through-hole forming states when the above-mentioned vacuum device 108 is used in combination with the above-mentioned through-hole device 103. FIG. 19(A) shows a state, wherein an alloy 162a has been injected into a through-hole prepared hole portion of a board 162; FIG. 19(B) shows a state, wherein the through-hole pin 154 is passed through the injected alloy 162a; and FIG. 19(C) shows a state, wherein the through-hole pin 154 has been extracted.

As shown in the above-mentioned FIGS. 19(A), (B) and (C), when the alloy 162a is injected, and when the through-hole pin 154 is passed through the injected alloy 162a, entrapped air can be extracted by the above-mentioned vacuum device 108, making it possible to prevent the generation of a through-hole defect due to an air bubble. Furthermore, the figures are shown such that there is a space between the alloy 162a and the die main body 151, but actually, this space does not exist.

Next, a wiring board manufacturing system, which uses a laser device 110 and a board take-up device 112 constituting the above-mentioned auxiliary unit 100, will be explained.

Figure 20:
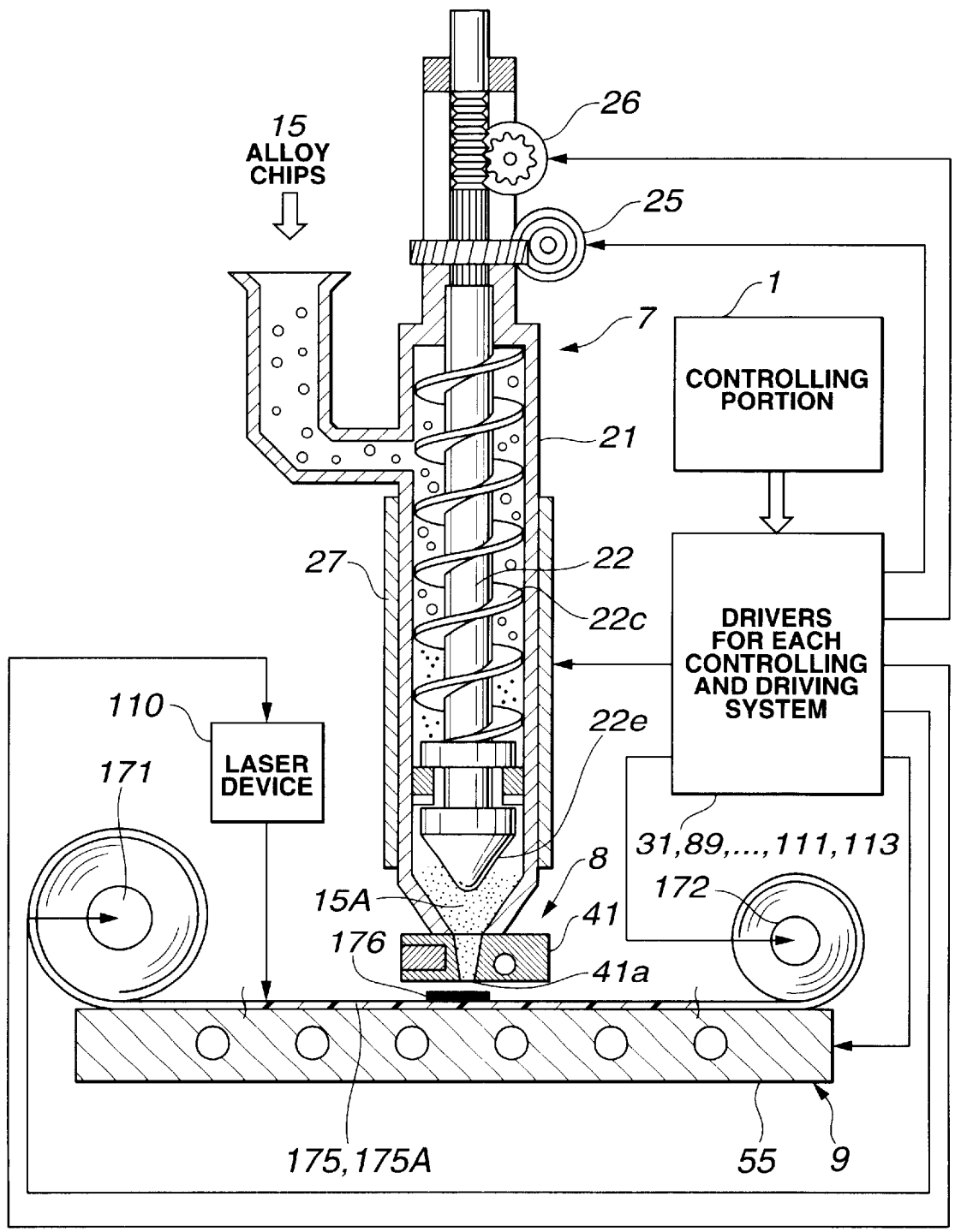
FIG. 20 is a layout view of the configuration of a system, which uses a laser device and a board take-up device from the auxiliary unit incorporated in the above-mentioned wiring board manufacturing system of the first embodiment of FIG. 1.

FIG. 20 is a layout view of the configuration of a wiring board manufacturing system incorporating the above-mentioned laser device 110 and board take-up device 112.

In this system, there are disposed a laser device 110 for irradiating a laser light disposed on the work stage 55; a flexible-board board feeding roller 171 and board take-up roller 172, supported in a rotatable condition on the work stage 55; drivers for each controlling and driving system, comprising a laser device driver 111, and a driver 113 for driving board feeding and take-up; and the above-mentioned feeding unit 7, drawing die unit 8 and stage unit 9 (see FIG. 1).

In this system, a raw material flexible board 175 is set on the work stage 55 by the roll-up operation of the feeding and take-up rollers 171, 172. Alloy slurry 15A generated by the feeding unit 7 is discharged from the drawing die unit 8, printing a desired wiring pattern on the set flexible board 175.

After the above-mentioned wiring pattern printing, the stage unit is moved on the basis of board external profile data inputted from either the CAD 5 or scanner 6, and when the desired external shape is cut out by irradiating a laser light from the laser device 110, a flexible wiring board 175A, on which an alloy conductive material has been printed, is produced.

The flexible board 175 is continuously rolled up by the take-up roller 172, and a flexible wiring board 175A can be manufactured successively by printing a wiring pattern on a new raw material flexible board 175 set on the work stage 55.

In a system incorporating the above-mentioned laser device 110 and board take-up device 112, the manufacture of a flexible wiring board 175A can be done automatically and continuously, increasing manufacturing efficiency. Further, a flexible board can be partially cut and easily removed with the above-mentioned laser device 110.

Further, it is also possible to continuously manufacture a flexible wiring board 175A having either a different wiring pattern, or a different board shape, and so forth.

Furthermore, with a system incorporating the above-mentioned laser device 110 and board take-up device 112, it is possible to manufacture a stacked flexible wiring board.

Figure 21A:
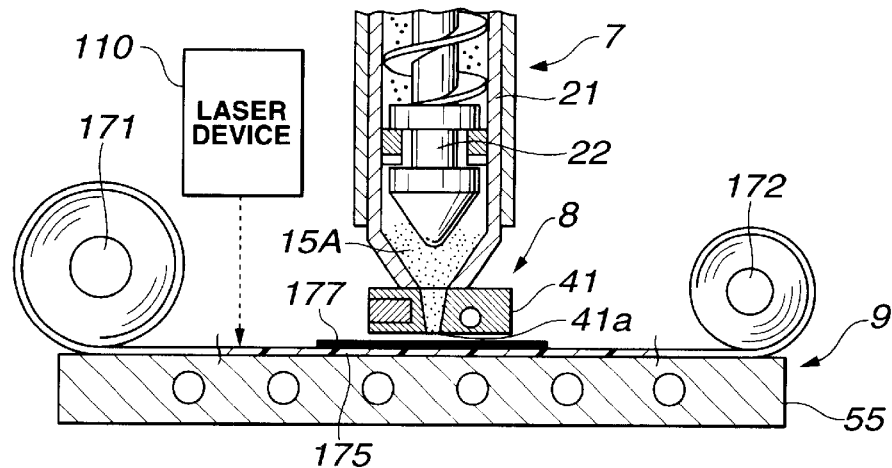
FIG. 21(A) is a cross-sectional view of an operating state showing a state for manufacturing a stacked flexible wiring board with a wiring board manufacturing system which uses the above-mentioned laser device and board take-up device of FIG. 20, and shows a wiring pattern printing state of a first layer of a flexible wiring board.
Figure 21B:
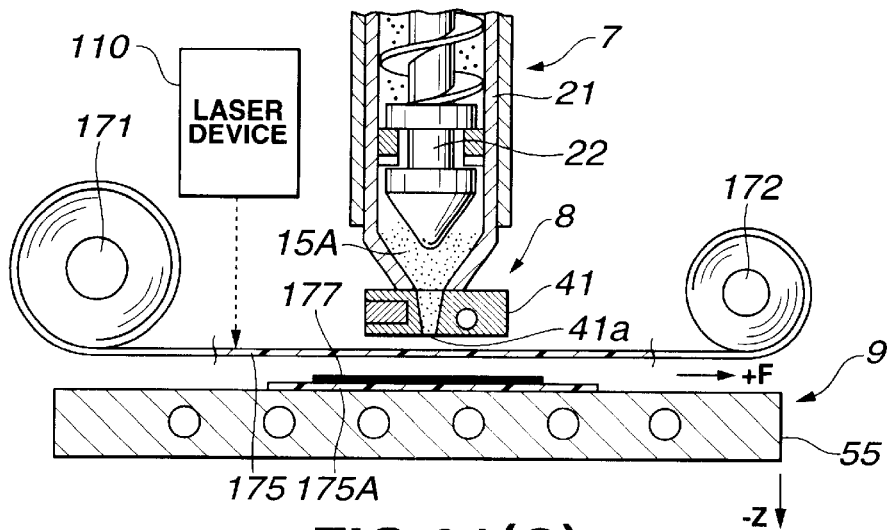
FIG. 21(B) is a cross-sectional view of an operating state showing a state for manufacturing a stacked flexible wiring board with a wiring board manufacturing system, which uses the above-mentioned laser device and board take-up device of FIG. 20, and shows a state, wherein the above-mentioned first layer of a flexible wiring board of the above-mentioned completed wiring pattern printing of FIG. 21(A) has been extracted.
Figure 21C:
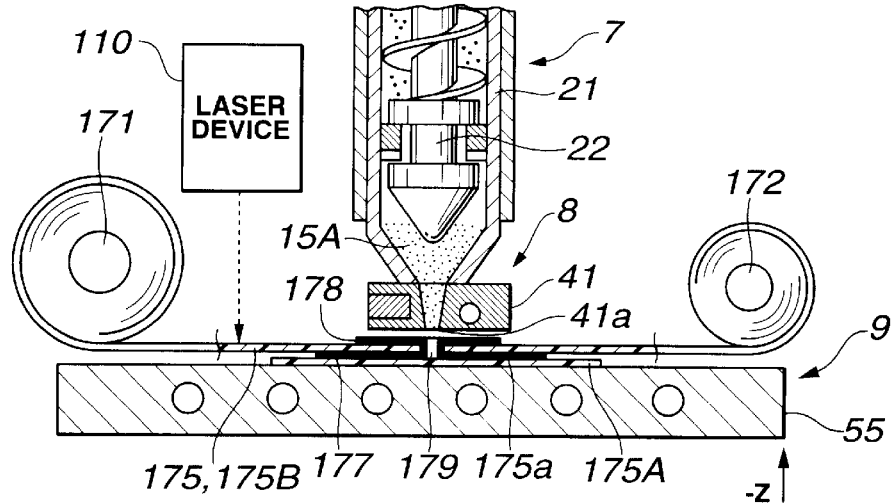
FIG. 21(C) is a cross-sectional view of an operating state showing a state for manufacturing a stacked flexible wiring board with a wiring board manufacturing system, which uses the above-mentioned laser device and board take-up device of FIG. 20, and shows a wiring pattern printing state, wherein a second layer of a flexible wiring board is stacked onto the upper portion of the above-mentioned first layer of a flexible wiring board of the above-mentioned FIG. 21(B)

FIGS. 21(A), (B) and (C) are cross-sectional views of operating states showing states during the manufacturing of the above-mentioned stacked flexible wiring board. FIG. 21(A) shows a wiring pattern printing state of a first layer flexible wiring board. FIG. 21(B) shows a state, wherein the above-mentioned first layer flexible wiring board for which wiring pattern printing has been completed is cut out. FIG. 21(C) shows a wiring pattern printing state in a state, wherein a second layer flexible wiring board is stacked on the top portion of the above-mentioned first layer flexible wiring board.

As shown in FIG. 21(A), alloy slurry 15A is supplied via the feeding unit 7 and drawing die unit 8 onto a first layer flexible board 175 on the work stage 55, and a wiring pattern 177 is printed in accordance with the alloy conductive material. Thereafter, a laser light is irradiated by the laser device 110, and the external profile of the first layer flexible wiring board 175A is cut out.

Next, as shown in FIG. 21(B), the work stage 55, on which the manufactured first layer flexible wiring board 175A is placed, is lowered once. The take-up roller 172 is rotated, the flexible board 175 is fed in the +F direction, and an unused portion of the flexible board 175 is positioned below the drawing die unit 8 as a second layer flexible board.

Next, as shown in FIG. 21(C), the work stage 55 is raised, and the surface of the wiring pattern portion 177 of the above-mentioned first layer flexible wiring board 175A is made to adhere to the bottom surface of the above-mentioned flexible board 175. In this state, alloy slurry 15A is supplied via the feeding unit 7 and drawing die unit 8 onto the second layer flexible board, and a wiring pattern 178 is printed with the alloy conductive material, producing a second layer flexible wiring board 175B.

Meanwhile, a through-hole prepared hole 175a is drilled with the laser device 110 on the second layer flexible wiring board 175B. Accordingly, the above-mentioned through-hole prepared hole 175a is moved beneath the drawing die unit 8, and alloy slurry 15A is injected thereinto. By forming a through-hole 179, in the part into which this alloy has been injected, by irradiating same with laser light of the laser device 110, the first layer and second layer flexible wiring boards 175A, 175B are stacked.

With first layer and second layer flexible wiring boards 175A, 175B, manufactured as described hereinabove, there is produced a stacked flexible wiring board of a state in which the wiring patterns 177, 178 thereof are electrically conductive and mechanically mounted in a fixed condition in accordance with alloy conductive material parts having the above-mentioned through-hole 179. In particular, the alloy slurry 15A injected into the through-hole prepared hole 175a is in a molten state at the initial injection, and satisfactory electrical contact state is achieved in the corresponding wiring pattern portions between the first layer and second layer boards.

Furthermore, the above-mentioned through-hole 179 can be processed using the above-mentioned laser device 110 into a shape that corresponds to the shape of an electrical component, which is to be mounted. Further, the above-mentioned through-hole 179 can also be a waste hole for either electrical conduction or for mechanical mounting in a fixed condition. Further, the above case describes an example of manufacturing a flexible wiring board of a two-layer constitution comprising a first layer and a second layer, but the number of stacked layers can also be increased further.

Further, the above-mentioned laser device 110 is not limited to the manufacture of the above-mentioned flexible wiring board, but rather, can, of course, also be used in the manufacture of a hard wiring board. For example, the above-mentioned laser device 110 can form a through-hole prepared hole and a through-hole on a hard board placed on the work stage 55, and can make arbitrary holes.

Further, by incorporating a mechanism part for inverting the top and bottom surfaces of the board feeding roller 171 and board take-up roller 172 of the above-mentioned board take-up device 112 on top of the work stage 55, it is possible to prepare both sides of a flexible wiring board.

Next, an end mill device 114 constituting the above-mentioned auxiliary unit 100 will be explained.

Figure 22:
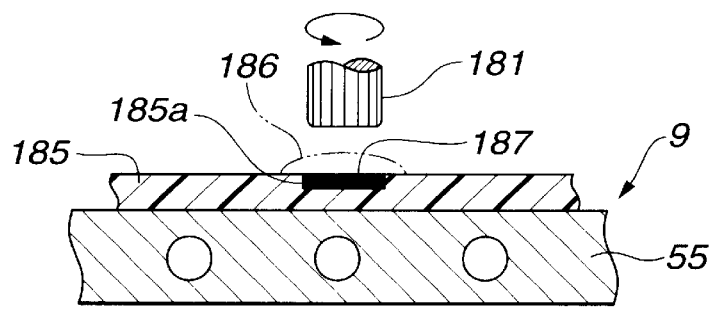
FIG. 22 is a cross-sectional view of a state, wherein a wiring pattern of a board is being processed using an end mill device from the auxiliary unit incorporated in the above-mentioned wiring board manufacturing system of the first embodiment of FIG. 1.

This end mill device 114 is a device having an end mill cutter for mechanical processing, and as shown in the cross-sectional view of FIG. 22 of a board in a state of being processed by the above-mentioned end mill device, the end mill cutter 181 can be set on the work stage 55, and a board can be subjected to mechanical processing on the work stage 55.

FIG. 22 shows a state, wherein a conductive metal mounting land for mounting an electrical member on a board is formed using the above-mentioned end mill device 114.

In the above-mentioned end mill device 114, a concave portion 185a is processed by the above-mentioned end mill cutter 181 on a board 185, which is mounted on the work stage 55 as shown in FIG. 22. Solder is placed in the concave portion 185a thereof by a solder bonding device provided separately. The solder buildup part 186 is processed so as to be a flat surface 187 by the end mill cutter 181. Since an electrical member is mounted on the above-mentioned flat surface 187, it sits well, making possible a reliable mount.

Furthermore, it is also possible for the above-mentioned concave portion 185a to be processed by either the above-mentioned end mill device 114 or the above-mentioned laser device 110, and for the above-mentioned alloy slurry 15A to be injected thereinto. The above-mentioned injected alloy conductive material bulges out very little from the concave portion 185a, and the thickness is constant, producing a flat surface. Therefore, in a case in which boards are stacked, because a convex portion is not generated, a stacked board having good thickness precision in the stacking direction is produced.

Further, as for the processed surface of the above-mentioned concave portion 185a, because a surface of arbitrary roughness is achieved, there is no need for pre-processing to make the surface rough in order to enhance adhesiveness when injecting an alloy conductive material. Further, due to the absence of the above-mentioned convex portion, there are fewer broken wires due to leads getting hooked when handling a board after wire pattern forming.

Furthermore, board through-hole processing is also possible with the above-mentioned end mill device 114. In this case, a through-hole prepared hole is processed using the above-mentioned end mill cutter 181, and furthermore, through-hole drilling is also performed. If this device is employed, through-hole processing can be performed using equipment that is less expensive than the above-mentioned laser device.

Next, a wiring board manufacturing system, which makes use of a solder bonding device 116 constituting the above-mentioned auxiliary unit 100, will be explained.

Figure 23:
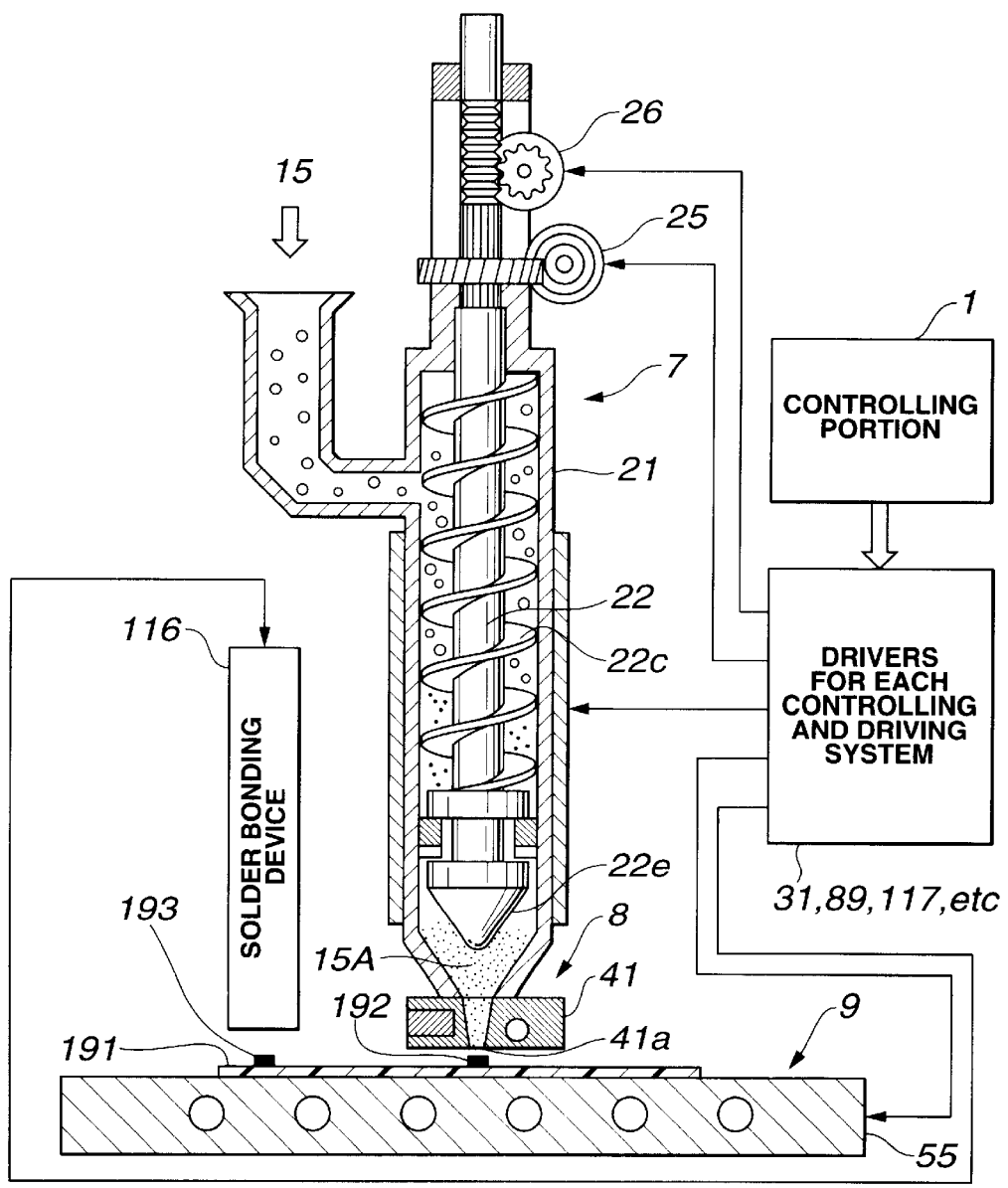
FIG. 23 is a layout view of the configuration of a system which uses a solder bonding device from the auxiliary unit incorporated in the above-mentioned wiring board manufacturing system of the first embodiment of FIG. 1.

FIG. 23 is a layout view of the constitution of the above-mentioned system, and in this system, there are disposed a solder bonding device 116, which is disposed on the work stage 55; drivers for each controlling and driving system comprising a solder bonding driver 117; and the above-mentioned feeding unit 7, drawing die unit 8, and stage unit 9 having a work stage 55 (see FIG. 1).

In this system, a wiring pattern 192 is formed by discharging an alloy slurry 15A via the feeding unit 7 and drawing die unit 8 onto a board 191, which is positioned and controlled in accordance with pattern data. Thereafter, an electrical member is soldered and mounted onto the wiring pattern with the above-mentioned solder bonding device 116.

The solder utilized in the above-mentioned soldering is for an aluminum solder, and comprises lithium chloride, potassium chloride, sodium chloride, and sodium fluoride, which are fluxes for aluminum. A soldering material, which makes for a good connection state with the alloy conductive material for forming the wiring pattern, is used.

Furthermore, if an ultrasonic bonding device or friction soldering device is utilized in place of the above-mentioned solder bonding device 116, there is no need to use solder containing flux as described hereinabove, and the generation of toxic substances due to the flux can be avoided.

Next, a wiring board manufacturing system, which makes combined use of a defect inspecting device 118 in addition to the above-mentioned laser device 110 and solder bonding device 116 constituting the above-mentioned auxiliary unit 100, will be explained.

Figure 24:
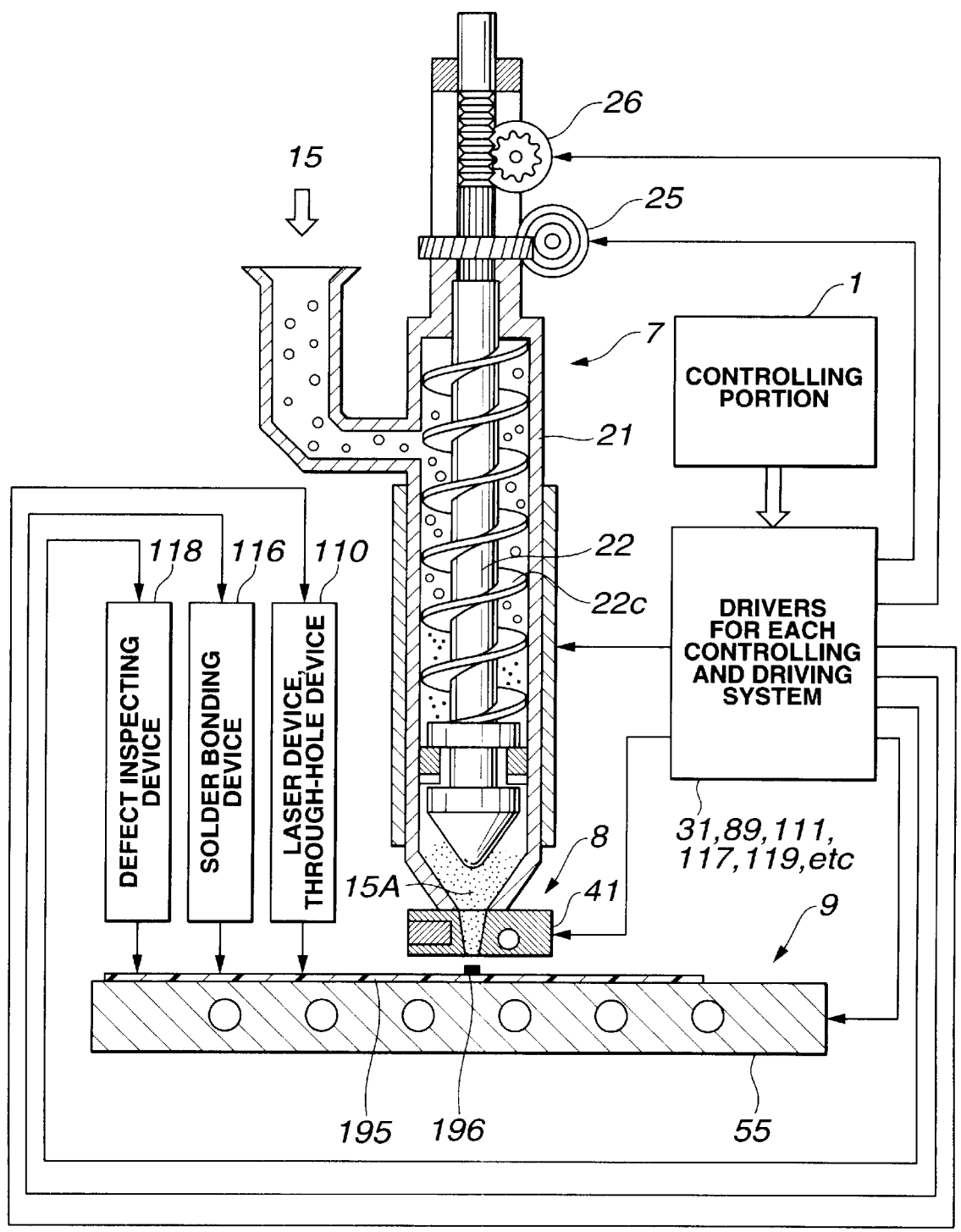
FIG. 24 is a layout view of the configuration of a system which uses a defect detecting device, laser device and solder bonding device from the auxiliary unit incorporated in the above-mentioned wiring board manufacturing system of the first embodiment of FIG. 1.

FIG. 24 is a layout view of the configuration of the above-mentioned wiring board manufacturing system. In this system, there are disposed a defect inspecting device 118, a laser device 110 and a solder bonding device 116 on the work stage 55, as well as drivers for each controlling and driving system, comprising a defect inspection driver 119, and the units shown in the above-mentioned FIG. 1, such as the above-mentioned feeding unit 7, drawing die unit 8 and stage unit 9.

In this system, a wiring pattern 196 is formed by discharging an alloy slurry 15A via the feeding unit 7 and drawing die unit 8 onto a board 195, which is positioned and controlled in accordance with pattern data. Thereafter, through-hole processing of the wiring board is performed by the laser device 110, and furthermore, an electrical member is soldered and mounted onto the wiring pattern by the solder bonding device 116.

Then, using the defect inspecting device 118, the formed wiring pattern and through-hole are inspected for defects, and furthermore, the mounting state of the electrical member is inspected. This defect inspecting device 118 comprises an optical inspecting device and an electrical conductivity inspecting device. The optical inspecting device inspects for defects by taking images of each inspected part, and analyzing the images. The electrical conductivity inspecting device inspects checkpoints using an inspection probe.

When a defect is detected by the above-mentioned defect inspecting device 118, defect repair, for example, modification of a wiring pattern or repair of a defective solder, can be performed as-is in the wiring board mounted state.

Next, a board inverting device 120 constituting the above-mentioned auxiliary unit 100 will be explained.

Figure 25:
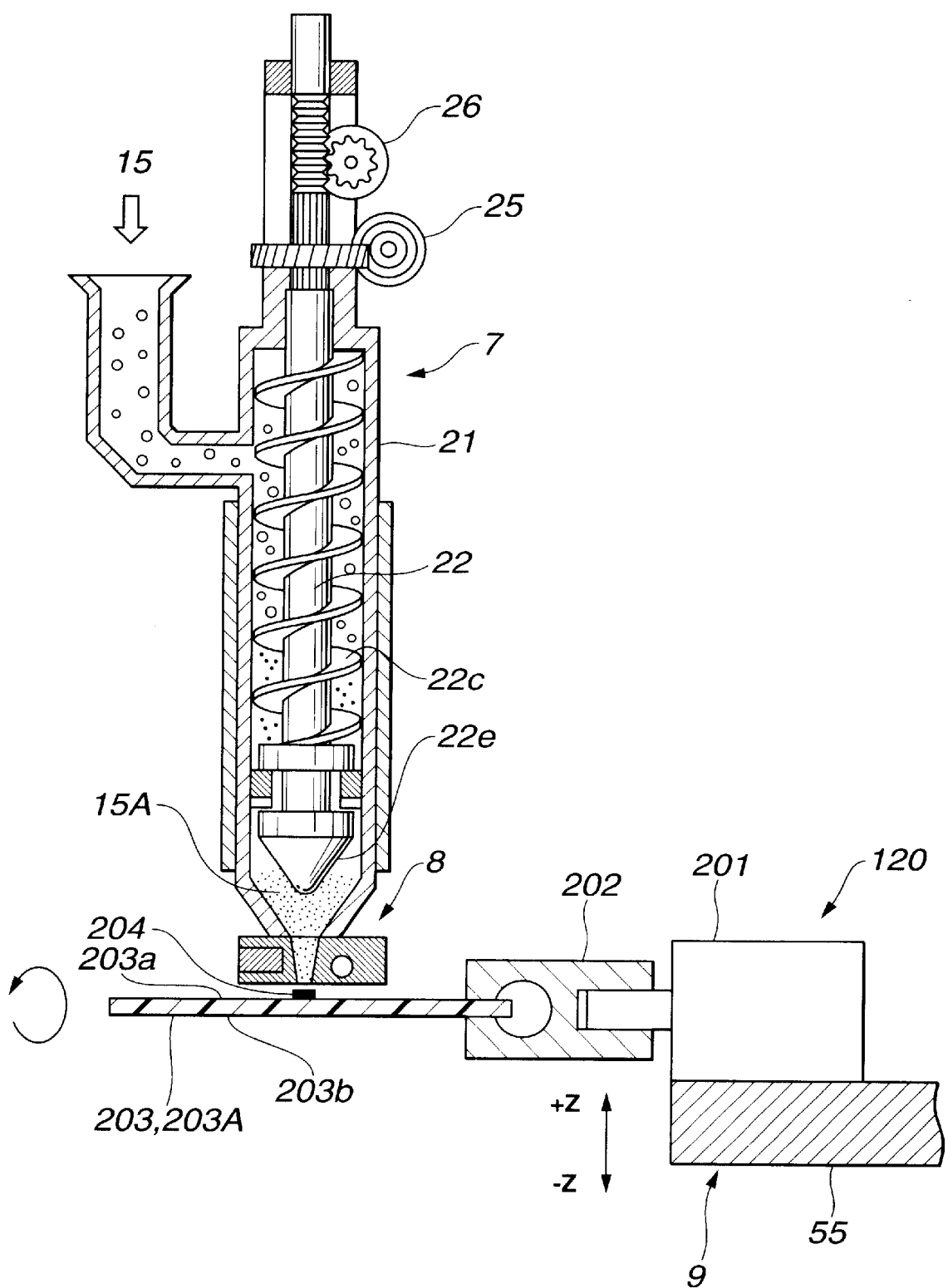
FIG. 25 is a cross-sectional view showing the mounted state of a board inverting device from the auxiliary unit incorporated in the above-mentioned wiring board manufacturing system of the first embodiment of FIG. 1.

This device 120 is a device for inverting a board front-to-back for forming a wiring pattern, and FIG. 25 is a cross-sectional view showing the mounted state of the above-mentioned board inverting device.

This board inverting device 120 comprises a board inversion driving portion 201 and a board holding portion 202. The above-mentioned board inversion driving portion 201 is mounted on the work stage 55, and circularly drivably supports the board holding portion 202. The board holding portion 202 supports one end of a board 203 in a freely detachable state.

When a wiring pattern is to be formed on both sides of the above-mentioned board 203, firstly, one side 203a of the board 203 is positioned opposite the drawing die unit 8. Then, while controlling the X, Y positions of the work stage 55 in line with wiring pattern data and discharging alloy slurry 15A, a wiring pattern 204 is printed on the one side 203a. When the forming of the generated pattern on the one side 203a of the board 203 is complete, the work stage 55 is lowered downwardly once, and the board 203 is inverted by the board inversion driving portion 201. The other side 203b of the board 203 is positioned opposite the drawing die unit 8. Accordingly, while controlling the X, Y positions of the work stage 55 in line with wiring pattern data and discharging alloy slurry 15A, a wiring pattern is printed on the other side 203b.

As described above, a wiring pattern can be formed on both sides 203a, 203b of a board 203, enabling the manufacture of a two-sided wiring board 203A.

Next, a dispenser 122 constituting the above-mentioned auxiliary unit 100 will be explained.

Figure 26:
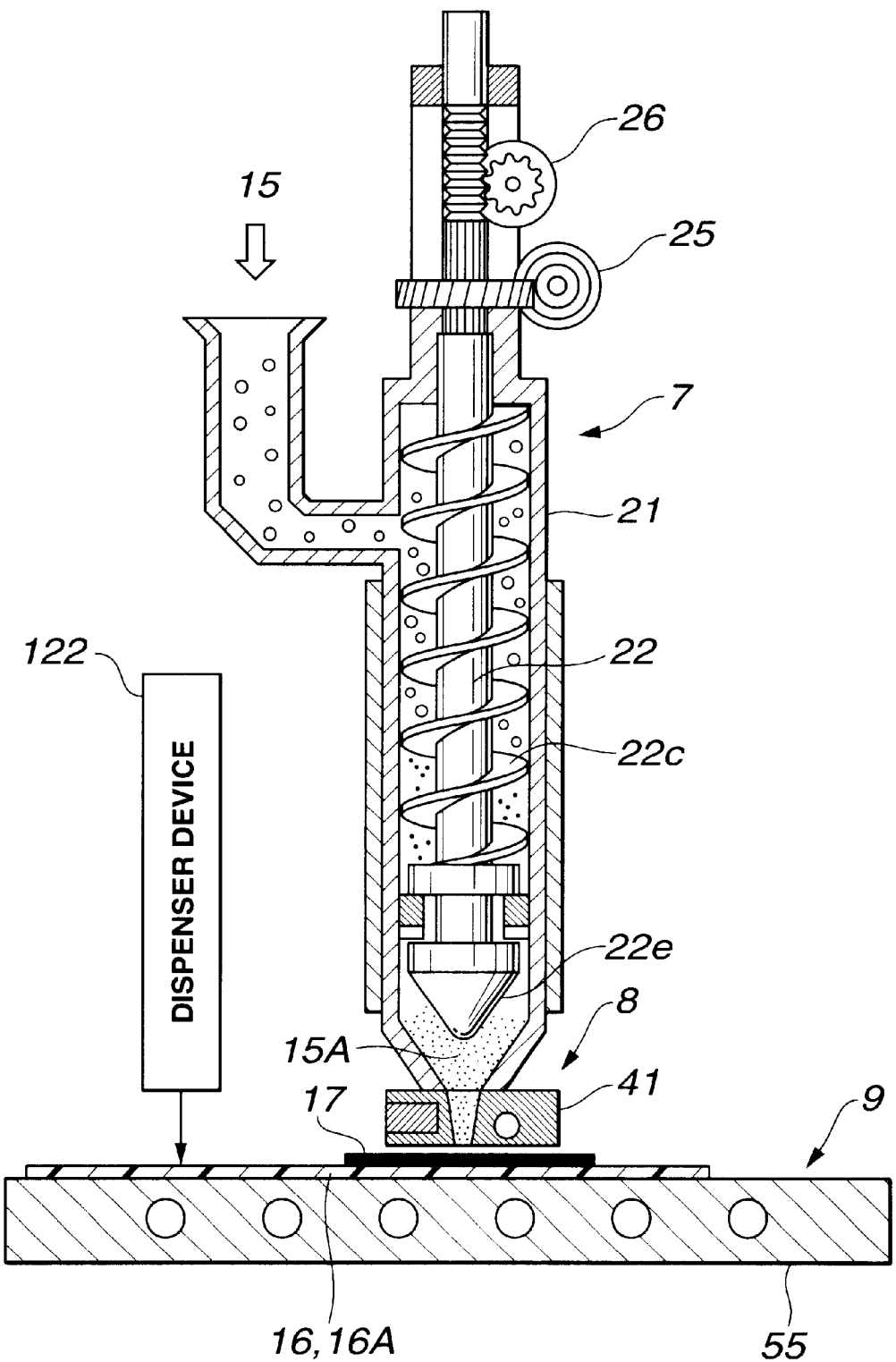
FIG. 26 is a layout view of the configuration of a system which uses a dispenser from the auxiliary unit incorporated in the above-mentioned wiring board manufacturing system of the first embodiment of FIG. 1.

This dispenser 122 is disposed on the top portion of the work stage 55 as shown in the system layout view of FIG. 26, and prints a desired notation, such as a part number, or board name on a wiring board 16A on which a wiring pattern 17 has been formed using an alloy conductive material. Furthermore, the above-mentioned wiring board 16A is such that a wiring pattern 17 has been formed by discharging an alloy slurry using the above-mentioned feeding unit 7, drawing die unit 8, and stage unit 9.

According to this dispenser 122, there is no need to carry out the printing of a part number, or board name at a different location, and the above-mentioned printing can be performed immediately after a wiring board 16A has been formed on a work stage 55.

Next, as a device not included in the auxiliary unit 100 of the above-mentioned FIG. 6, a wiring pattern surface protecting device, which enables formation of a wiring pattern on a board to be carried out in an inert gas environment, will be explained.

Figure 27:
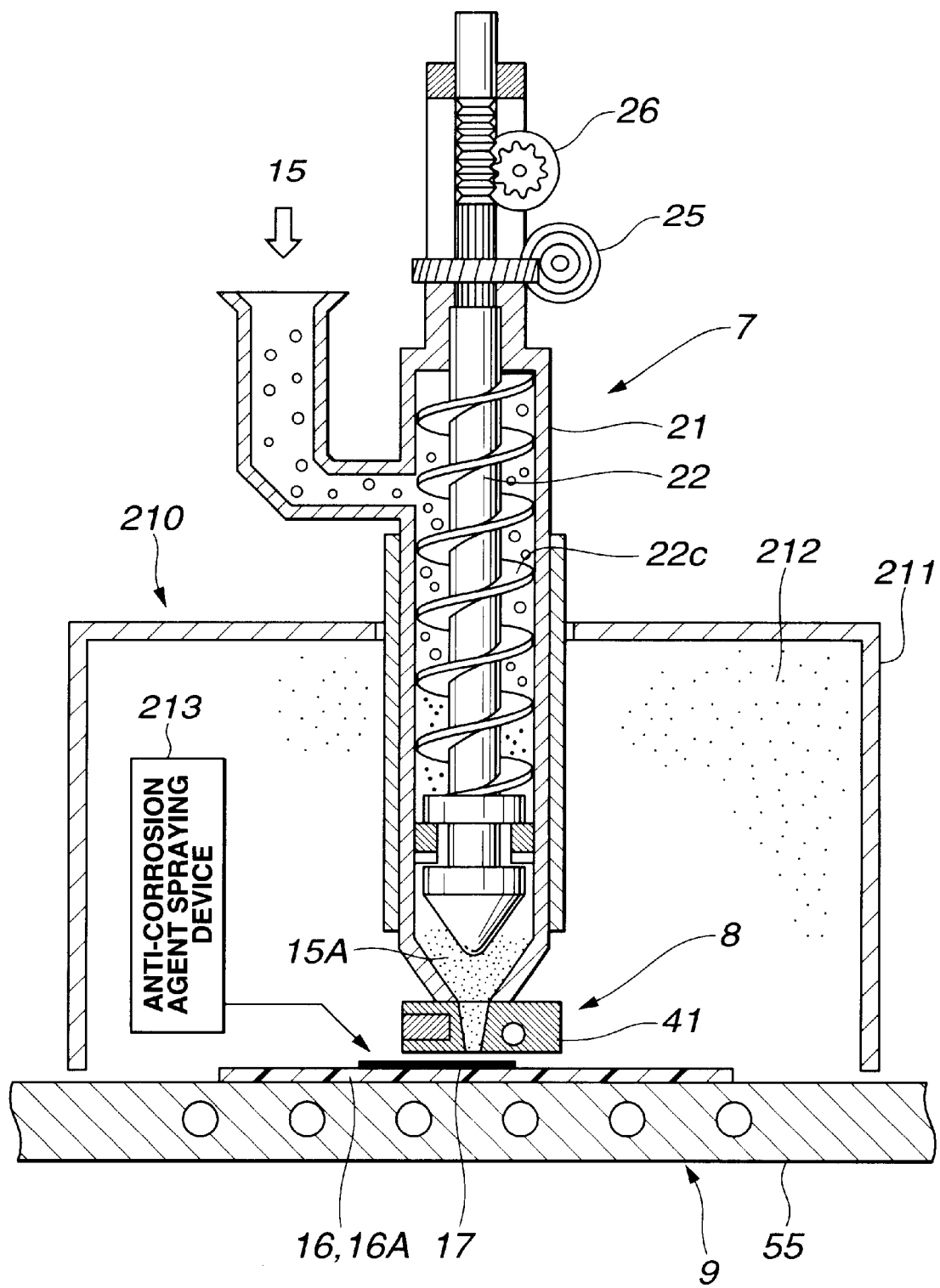
FIG. 27 is a layout view of the configuration of a system which adds a wiring pattern surface protecting device to the above-mentioned wiring board manufacturing system of the first embodiment of FIG. 1.

FIG. 27 is a layout view of a state, wherein this wiring pattern surface protecting device 210 is mounted on a wiring board manufacturing system 10.

This wiring pattern surface protecting device 210 covers the area around the discharge portion of the alloy slurry 15A of the above-mentioned wiring board manufacturing system 10, that is, around the drawing die unit 8, and has an outside air shielding cover 211, which seals and maintains the surface of the work stage 55. The inside of this outside air shielding cover 211 is filled with an inert gas 212.

When this wiring pattern surface protecting device 210 is not utilized, the alloy slurry (alloy conductive material) 15A discharged from the drawing die unit 8 is a high temperature in the initial state at which same is printed as a wiring pattern 17, and the alloy slurry 15A reacts with the moisture, carbon gas, and oxygen in the air, forming a metallic coating, such as magnesium hydroxide, magnesium carbonate, or magnesium oxide on the surface of the discharged slurry, and causing trouble, such as combustion resulting from magnesium oxidation. Furthermore, when the alloy is an aluminum alloy, alumina is generated on the surface, causing the same trouble.

Accordingly, when this wiring pattern surface protecting device 210 is utilized, the alloy slurry (alloy conductive material) 15A from the drawing die unit 8 is discharged inside an inert gas 212, making it possible to prevent the generation of the above-mentioned metallic coating, and so forth.

Furthermore, as shown in FIG. 27, when an anti-corrosion agent dispensing device 213 is provided inside the outside air shielding cover 211 of the above-mentioned wiring pattern surface protecting device 210, a gas anti-corrosion agent can be sprayed onto the wiring pattern 17 forming part. By spraying the above-mentioned anti-corrosion agent, the surface of the wiring pattern (alloy conductive material) maintains an active state, doing away with the need for chemical treatments, such as pickling. It is supposed that the above-mentioned anti-corrosion agent is a magnesium anti-corrosion agent, such as chromic acid or manganic acid.

Next, a discharge opening clog preventing device for preventing clogging of the discharge opening 41a, which is provided in the die main body 41 of the drawing die unit 8 of the above-mentioned wiring board manufacturing system 10, will be explained.

Figure 28:
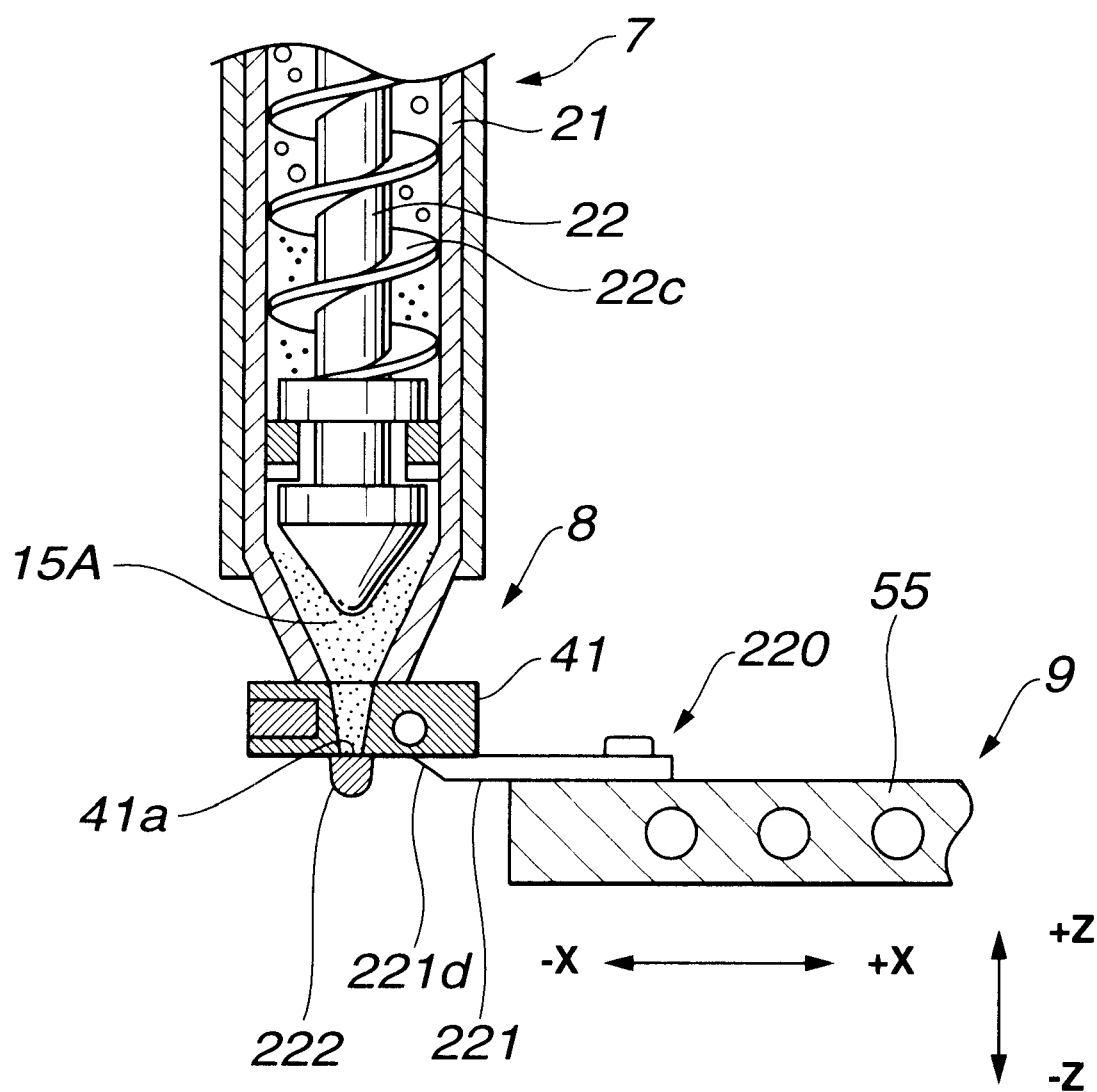
FIG. 28 is a longitudinal cross-sectional view of the vicinity of a discharge opening clog preventing device incorporated in the above-mentioned wiring board manufacturing system of the first embodiment of FIG. 1.

FIG. 28 is a longitudinal cross-sectional view in the vicinity of the drawing die unit of the mounted state of the above-mentioned discharge opening clog preventing device 220.

The above-mentioned discharge opening clog preventing device 220 comprises a cutter 221 mounted in a fixed condition on the work stage 55. In the cutter 221, a cutting portion 221a is provided in the tip portion.

When a hardened part 222 occurs in the alloy slurry 15A, constituting a clogged state in the discharge opening 41a of the die main body 41, the hardened part 222 in the above-mentioned discharge opening 41a is removed by the above-mentioned discharge clog preventing device 220.

In the removal operation thereof, first, the work stage 55 of the stage unit 9 moves up-down, right-left, positioning the cutting portion 221a of the cutter 221 on the bottom surface of the die main body 41.

Accordingly, in the state of FIG. 28, when the work stage 55 is moved in the −X direction, the above-mentioned alloy slurry 15A hardened part 222 is removed by the cutter 221. Since the discharge opening 41a of the die main body 41 is restored as a result of removing the immobilized part 222, alloy slurry 15A can be re-discharged in a good state.

Next, a wiring board manufacturing system comprising a plurality of feeding units, which is an electric wiring forming system of a second embodiment of the present invention, will be explained.

Figure 29:
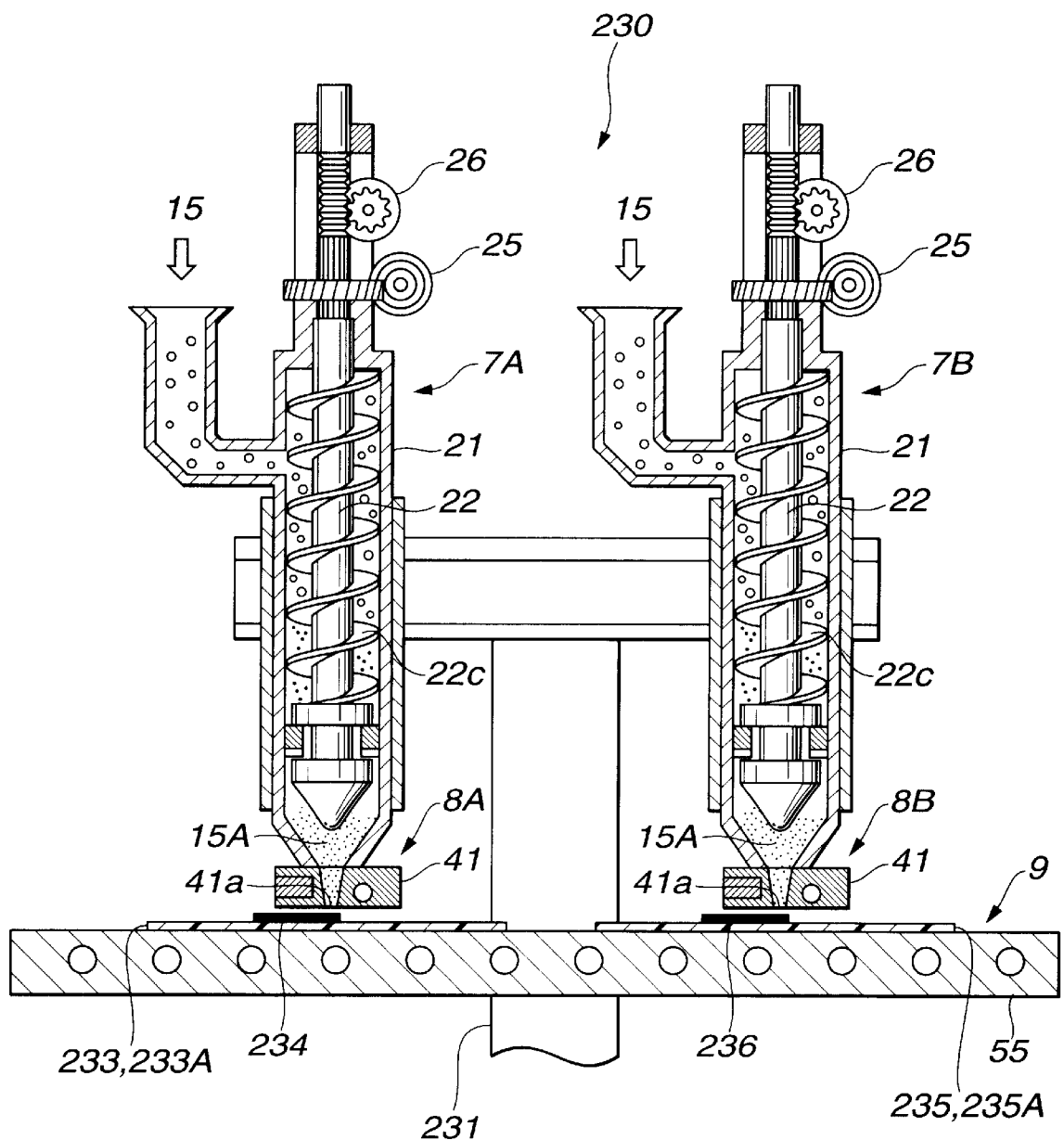
FIG. 29 is a longitudinal cross-sectional view of the vicinity of feeding units in a wiring board manufacturing system comprising a plurality of feeding units, which is an electric wiring forming system of a second embodiment of the present invention.

The wiring board manufacturing system 230 of this embodiment has two sets of feeding units 7A, 7B and drawing die units 8A, 8B, as shown in the layout view of the vicinity of the feeding unit portion of FIG. 29, and in addition, is constituted from the same constituent units as the above-mentioned wiring board manufacturing system 10. With this system 230, either two wiring boards, or a wiring board on which two circuit portions of the same wiring pattern are formed, can be manufactured simultaneously. At this time, if the feeding unit on one side (for example, feeding unit 7B) should operate alone, then the stage unit can be on the feeding unit 7B side only.

The above-mentioned feeding units 7A, 7B and drawing die units 8A, 8B, respectively, have the same structures as the feeding unit 7 and drawing die unit 8 utilized in the above-mentioned wiring board manufacturing system 10. And feeding units 7A, 7B and drawing die units 8A, 8B, respectively, are supported by a frame support 231, but the fixed position thereof can be adjusted on the flat surface X axis, Y axis in accordance with the specifications of the board being manufactured.

When manufacturing a wiring board, two board materials 233, 235 are set in positions beneath the drawing die units 8A, 8B on the work stage 55. The above-mentioned board materials 233, 235 can be either single boards, or a board having several patterns.

Alloy chips 15 are loaded into feeding units 7A, 7B, respectively, and alloy slurry 15A is discharged onto boards 233, 235 from the discharge opening 41a of each drawing die unit 8A, 8B. When the work stage 55 is simultaneously driven and controlled along the X-axis and Y-axis based on wiring pattern data, either two wiring boards 233A, 235A on which are formed the same wiring pattern 234, 236, or a single board possessing the same two patterns, are manufactured.

With the wiring board manufacturing system 230 of the above-mentioned second embodiment, because two wiring patterns are formed on a board at the same time, wiring board manufacturing time can be shortened. Furthermore, the above-mentioned two sets of feeding units and drawing die units are not limited to two sets, and a system can constitute two or more sets. Further, the two sets of feeding units can be feeding units of differing specifications, and similarly, the two sets of drawing die units can be drawing die units of differing specifications. When units of differing specifications like this are used, it becomes possible, for example, to supply different metal chips to each, and to form wiring patterns using different conductive metals.

Next, a wiring board manufacturing system comprising multiple discharge openings, which is an electric wiring forming system of a third embodiment of the present invention, will be explained.

Figure 30:
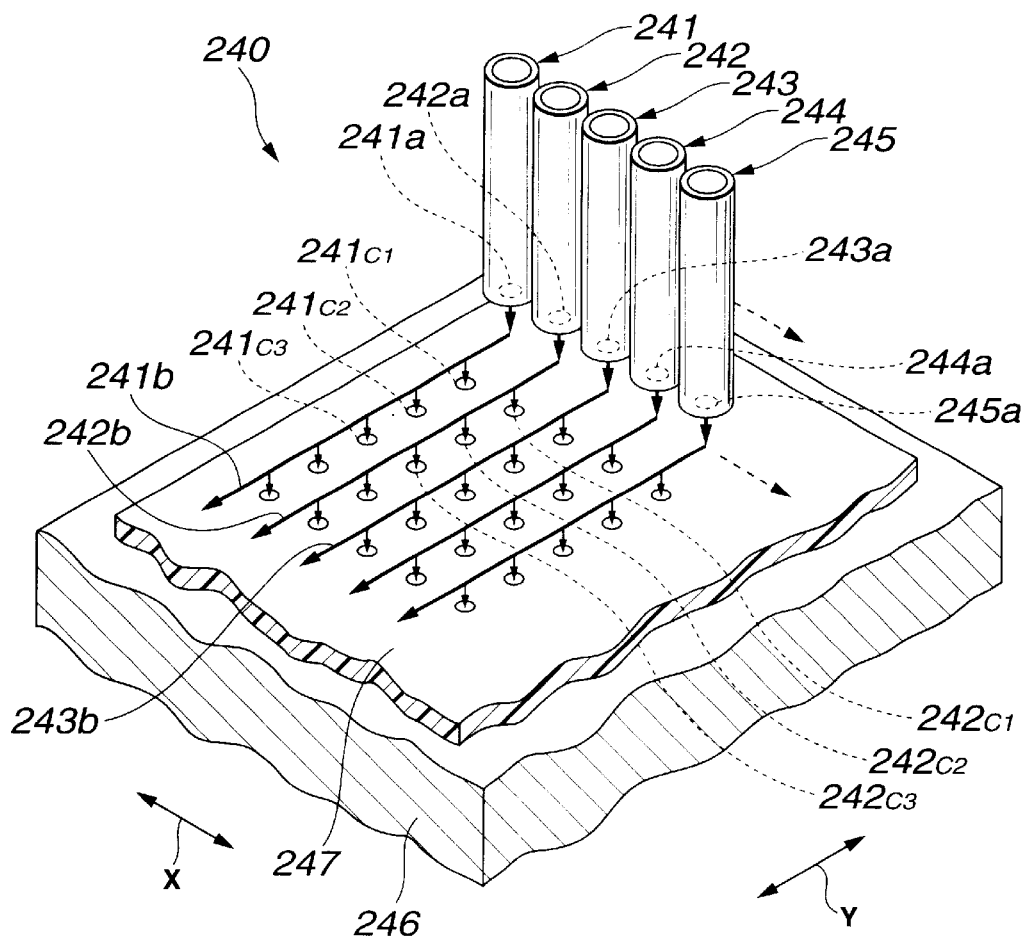
FIG. 30 is a schematic perspective view showing the layout in the vicinity of a feeding unit in a wiring board manufacturing system comprising multi-discharge openings, which is an electric wiring forming system of a third embodiment of the present invention.

The wiring board manufacturing system 240 of this embodiment is a system, which further increases the number of feeding units relative to the above-mentioned system comprising a plurality of feeding units, and is a system for forming dot-shaped wiring patterns by discharging alloy slurry in pointed shapes from multiple fine-pitched alloy slurry discharge openings. As shown in the schematic perspective view of FIG. 30 showing the layout, this system has multiple groups of fine-pitched cylinders 241, 242, 243, 244, 245, . . . arranged in the X-axis direction. In each cylinder group 241, 242, 243, . . . there are disposed respective alloy slurry discharge openings 241a, 242a, 243a, . . .

Furthermore, linking tubes 241b, 242b, 243b, . . . for linking each of the above-mentioned discharge openings 241a, 242a, 243a, . . . are disposed along the Y-axis. Further, in the above-mentioned linking tube 241b, there are disposed fine-pitched alloy slurry discharge openings 241c1, 241c2, 241c3, . . . Similarly, in the above-mentioned linking tube 242b, there are also disposed fine-pitched alloy slurry discharge openings 242c1, 242c2, 242c3, . . . Fine-pitched alloy slurry discharge openings are also disposed in the above-mentioned linking tube 243b. Furthermore, with regard to cylinder group 244, 245, . . . as well, linking tubes and fine-pitched alloy slurry discharge openings are similarly disposed.

Furthermore, in each of the above-mentioned slurry discharge openings, a freely advancing and retreating movable pin is mated to each discharge opening, and a pin heater corresponding to each movable pin is disposed in the vicinity of each of the above-mentioned movable pins. By controlling the advancing and retreating movement of the above-mentioned movable pins and the temperature of the pin heaters, the discharge of alloy slurry from each of the above-mentioned slurry discharge openings 241c1, 241c2, . . . , 242c1, 242c2, . . . , and discharge stoppage are controlled.

Next, a wiring pattern forming operation in a wiring board manufacturing system 240 of a third embodiment constituted as hereinabove will be explained.

Figure 31:
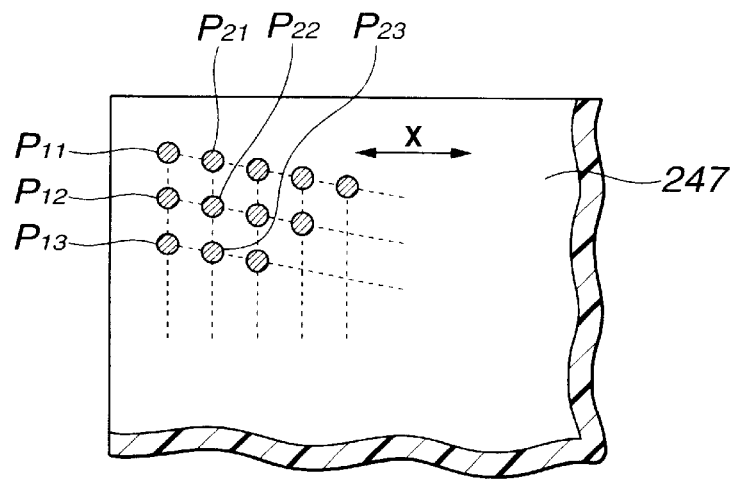
FIG. 31 is a diagram showing the layout of a wiring pattern configured as a dot pattern formed with the above-mentioned wiring board manufacturing system of FIG. 30.

To form the above-mentioned wiring pattern, dot-shaped alloy slurry is discharged onto a board 247 from specified slurry discharge openings by controlling each of the above-mentioned movable pins and pin heaters in a state, wherein the work stage 55 is in a desired position. FIG. 31 shows a wiring pattern resulting from fine-pitched dots P11, P12, P13, . . . , P21, P22, P23, . . . , formed when alloy slurry is discharged in dot shapes from the above-mentioned slurry discharge openings.

The shape of the above-mentioned dot-shaped wiring pattern is determined by selecting discharge openings from which alloy slurry should be discharged on the basis of pattern data received via the CAD 5 or scanner 6. Furthermore, the gaps possible between the above-mentioned dots can be eliminated by selecting slurry discharge openings when the work stage 246 is moved in the X-axis direction.

According to the wiring board manufacturing system 240 of the above-mentioned third embodiment, it is possible to rapidly form on a board a wiring pattern of an arbitrary shape received via the CAD 5 or scanner 6.

Next, a wiring board manufacturing system having a compound cylinder, which is an electric wiring forming system of a fourth embodiment, will be explained.

Figure 32:
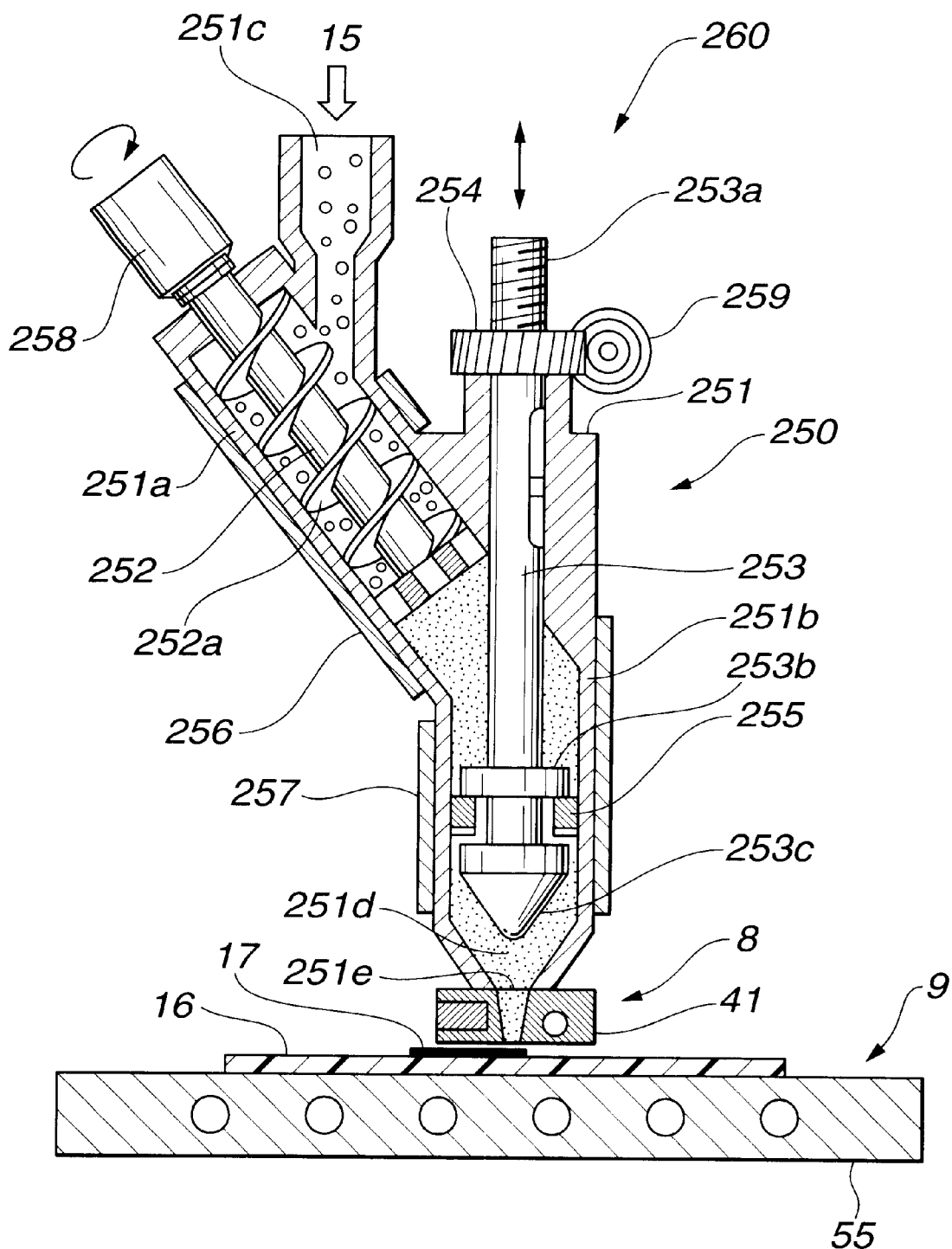
FIG. 32 is a longitudinal cross-sectional view of the vicinity of a feeding unit in a wiring board manufacturing system comprising a compound cylinder, which is an electric wiring forming system of a fourth embodiment of the present invention.

The wiring board manufacturing system 260 of this embodiment is a system, which uses a compound cylinder feeding unit constituting a dedicated mixing cylinder and a dedicated discharging cylinder as the alloy feeding unit. FIG. 32 is a longitudinal cross-sectional view showing the layout in the vicinity of the feeding unit of the above-mentioned system 260.

The compound cylinder 251 constituting the feeding unit 250 of this system 260 comprises a dedicated mixing cylinder 251a, which is provided in a diagonal condition, and a dedicated discharging cylinder 251b linked to this cylinder 251a.

In the dedicated mixing cylinder 251a, there are incorporated a rotational drive motor 258, a screw shaft 252, which is rotated and driven by this motor, and a heater 256 on the peripheral portion thereof. Furthermore, an alloy chip loading opening 251c is disposed on the upper portion of the dedicated mixing cylinder 251a.

Furthermore, on the above-mentioned screw shaft 252, there is disposed a screw portion 252a for mixing and transporting.

In the dedicated discharging cylinder 251b, there are incorporated a plunger drive motor 259; a plunger 253 capable of advancing and retreating axially; a wormwheel 254, which screws together at the inside perimeter portion to the plunger 253 feed screw 253a; a radially slidable backflow prevention ring 255 on the inside of the cylinder main body 251; and a heater 257 on the peripheral portion thereof. Furthermore, a slurry well 251d and a slurry discharge opening 251e are disposed at the lower portion of the dedicated discharging cylinder 251b.

Furthermore, on the above-mentioned plunger 253, there are disposed an upward feed screw 253a, a flange-shaped presser portion 253b capable of making contact with the backflow prevention ring 255, and a tip portion 253c.

In the lower portion of the discharge opening 251e of the dedicated discharging cylinder main body 251b, there is mounted the die main body 41 of a drawing die unit 8 similar to the case of the above-mentioned wiring board manufacturing system 10. Furthermore, the work stage 55 of the stage unit 9 is disposed below the drawing die unit 8.

A wiring pattern forming operation of a wiring board, in a wiring board manufacturing system of a fourth embodiment constituted as described hereinabove, is approximately the same as the case of the above-mentioned wiring board manufacturing system 10. However, because the generating state of the alloy slurry inside the compound cylinder 251 differs, only the points that differ therefrom will be explained hereinbelow.

Magnesium alloy chips 15 are loaded via the loading opening 251c together with an inert gas. When the screw shaft 252 of the mixing cylinder 251a side begins to rotate, the above-mentioned alloy chips 15 are mixed in by the screw portion 252c, and, while being compressed, are sent diagonally downward. Thereafter, the above-mentioned alloy chips 15 are ultimately heated to approximately 550° C. by the cylinder heater 256, mixed and compressed, and changed into an alloy slurry 15A of a thixotropic state, wherein viscosity is reduced and fluidity is increased.

The above-mentioned thixotropic state alloy slurry 15A flows into the inside of the dedicated discharging cylinder 251b during the upward stroke of the plunger 253 of the dedicated discharging cylinder 251b, and then moves to the slurry well 251d. Accordingly, when the plunger 253 switches to a downward stroke, the alloy slurry 15A is discharged from the discharge opening 251e at a predetermined rate to the die main body 41 of the drawing die unit 8.

Thereafter, the alloy slurry 15A is discharged from the discharge opening 41a of the die main body 41 of the drawing die unit 8 onto a board 16 on the moving work stage 55, and a wiring pattern is formed.

With the wiring board manufacturing system 260 of the above-mentioned fourth embodiment, since the constitution is such that the operations of mixing alloy chips into a thixotropic state slurry and discharging this slurry are performed by a compound cylinder divided into a dedicated mixing cylinder and a dedicated discharging cylinder, the melting, mixing and discharging of alloy chips is accomplished efficiently, and a slurry of a good thixotropic state having high fluidity is achieved, enabling the manufacture of a wiring board with few defects in wiring pattern shape and so forth.

Next, a wiring board manufacturing system using a movable feeding unit, which is an electric wiring forming system of a fifth embodiment, will be explained.

In the wiring board manufacturing system 10 of the above-mentioned first embodiment, a configuration was adopted, which mounts the board side, which constitutes the work, on a position-controlled stage unit, and immobilizes the feeding unit side, which feeds an alloy conductive material. By contrast thereto, in the wiring board manufacturing system 310 of this embodiment, a configuration was adopted, which mounts the feeding unit side to a position-controlled stage unit, and immobilizes and supports the board side, which constitutes the work.

Figure 33:
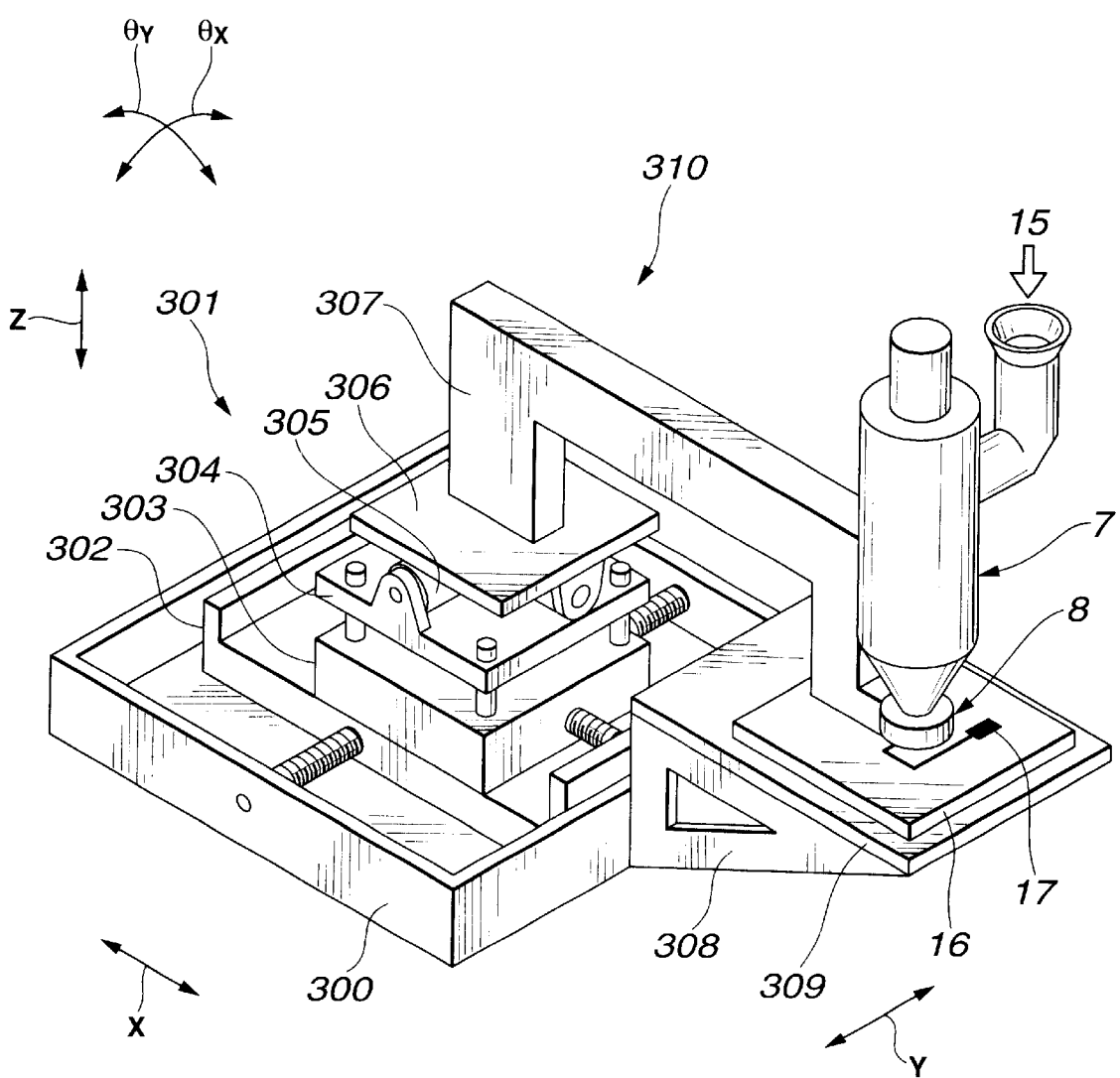
FIG. 33 is a perspective view showing an external view of a wiring board manufacturing system employing a movable feeding unit, which is an electric wiring forming system of a fifth embodiment of the present invention.

FIG. 33 is a perspective view showing the external appearance of this wiring board manufacturing system 310. However, the controller, keyboard and so forth of this system are not shown in the figure.

As shown in FIG. 33, the feeding unit 7 of this wiring board manufacturing system 310 is supported via a support bracket 307 relative to the driven stage 306 of the stage unit 301, which is a moving stage. Conversely, a board 16 is mounted on a work platform 309. The above-mentioned work platform 309 is affixed and supported by a bracket 308, which is mounted in a fixed condition to a base 300. Furthermore, the above-mentioned feeding unit 7 is not limited to a single unit, and the constitution can be such that a plurality of feeding units is mounted.

The above-mentioned stage unit 301 is a control stage capable of being driven along 5 axes. That is, the stage unit 301 is constituted from a Y stage 302, which is movably supported in the Y-axis direction via a feeding screw in the base 300; an X stage 303, which is movably supported in the X-axis direction via a feeding screw in the Y stage 302; a Z stage 304, which is movably supported in the Z-axis direction via a feeding screw in the X stage 303; a θY stage 305, which is rotatably supported in the θY direction via a drive gear in the Z stage 304; and a driven stage 306, which is a θX stage rotatably supported in the θX direction via a drive gear in the θY stage 305.

Furthermore, configurations other than those mentioned above are the same as that of the system of the above-mentioned first embodiment.

As the wiring pattern forming operation according to the wiring board manufacturing system 310 of this fifth embodiment, which is constituted as hereinabove, a magnesium alloy constituting the conductive metal is melted until a thixotropic state is achieved, an alloy slurry thereof is generated by the above-mentioned feeding unit 7, and discharged onto an immobilized and supported board 16. Because the above-mentioned feeding unit 7 is supported by the above-mentioned stage unit 301, which is driven and controlled along 5 axes, and moves in line with wiring pattern data in synchronization with the discharge of the above-mentioned alloy slurry, a wiring pattern is formed on a board by the above-mentioned alloy.

With the wiring board manufacturing system 310 of this fifth embodiment, because the same effects as the system of the above-mentioned first embodiment are achieved, and more particularly, because the feeding unit of the side, which discharges alloy, moves along a wiring pattern, the arithmetic operation for generating stage unit 301 driving data from wiring pattern data in the controlling portion 1 is simple. Further, because the board side, which constitutes the work, is immobilized, inspection of a wiring pattern forming state, and board handling is easy. Further, by having a plurality of feeding units, it is possible to deal with a variety of wiring patterns.

As described hereinabove, according to the present invention, it is possible to form a desired wiring pattern by melting and mixing a conductive metal in a cylinder portion in an electric wiring forming system, and discharging the conductive metal thereof, which is melted, along a wiring pattern locus onto an electric board, which is mounted on a moving stage, and it is possible to eliminate the adverse affects on the environment resulting from waste liquid during conventional wiring pattern forming, and moreover, it is possible to shorten the time required for wiring board manufacturing.

What is claimed is:

1. An electric wiring forming system, comprising:
   a cylinder including a heater for melting a conductive metal;
   a screw provided in said cylinder for mixing and discharging said conductive metal;
   a drawing die for forming a variable discharge opening diameter in a discharge opening for discharging the conductive metal onto a board for mounting electrical elements;
   a moving stage for moving either said board for mounting electrical elements, or said drawing die; and
   a controlling device for controlling the movement of said moving stage,
   wherein said conductive metal, which is melted, is discharged via said drawing die onto said board for mounting electrical elements, which is mounted on said moving stage, and is disposed so as to have a predetermined clearance relative to said drawing die, and a desired wiring pattern is formed.

2. The electric wiring forming system according to claim 1, wherein said conductive metal is one of magnesium, magnesium alloy, aluminum, or aluminum alloy.

3. An electric wiring forming system according to claim 1, further comprising:
   a wiring pattern surface protecting device which uses an inert gas to shield the wiring pattern surface from the outside air.

4. The electric wiring forming system according to claim 1, further comprising a cooling gas spray opening in a vicinity of the discharge opening of said drawing die.

5. The electric wiring forming system according to claim 1, further comprising a changing device for automatically changing the discharge opening diameter of said drawing die.

6. An electric wiring forming system according to claim 1, further comprising:
   a solder bonding device which solder-bonds electrical elements on said board having the wiring pattern formed therein.

7. The electric wiring forming system according to claim 6, wherein a solder utilized in said solder bonding device comprises an aluminum solder flux as a constituent.

8. The electric wiring forming system according to claim 6, wherein said solder bonding device carries out soldering using one of ultrasonic waves or friction.

9. The electric wiring forming system according claim 1, further comprising a movable pin disposed inside the discharge opening provided in said drawing die.

10. An electric wiring forming system according to claim 1, wherein
    the discharging of a conductive metal by the drawing die is performed onto the surface of the board for mounting electrical elements which has been subjected to a treatment for preventing the peeling off of said desired wiring pattern.

11. The electric wiring forming system according to claim 1, further comprising a scanner for introducing a wiring pattern which is formed on said board for mounting electrical elements.

12. The electric wiring forming system according to claim 1, further comprising a plurality of suction openings formed in a surface of said moving stage, which faces said board for mounting electrical elements, and a vacuum device linked to the suction openings.

13. The electric wiring forming system according to claim 1, further comprising a through-hole unit for forming a through-hole in said board for mounting electrical elements.

14. The electric wiring forming system according to claim 13, wherein said through-hole unit comprises an end mill.

15. The electric wiring forming system according to claim 13, further comprising a concave portion corresponding to said wiring pattern formed on said board for mounting electrical elements by said through-hole unit, and wherein said conductive metal is discharged into said concave portion.

16. The electric wiring forming system according to claim 1, further comprising a pattern defect inspecting device for inspecting said board for mounting electrical elements on which said desired wiring pattern is formed.

17. The electric wiring forming system according to claim 1, wherein said board for mounting electrical elements is formed from one of a super engineering plastic or a heat-resistant fiber.

18. The electric wiring forming system according to claim 1, further comprising a feed/take-up mechanism constituting a feeding portion for holding said board for mounting electrical elements in a roll shape, and, in addition, for feeding said board for mounting electrical elements beneath the discharge opening of said drawing die, and a taking-up portion for taking up said board for mounting electrical elements, which has been fed.

19. The electric wiring forming system according to claim 18, further comprising cutting means for cutting an essential part of the board for mounting electrical elements, which has been fed from said feeding portion.

20. An electric wiring forming system according to claim 19, further comprising:
    a controlling portion which controls the sequence of stacking the boards for mounting electrical elements, which have been cut by said cutting means in accordance with through-holes formed in the boards for mounting electrical elements.

21. An electrical wiring forming system according to claim 1, further comprising:
    means for inverting the front and back sides of the board for mounting electrical elements to be fed.

22. An electrical wiring forming system according to claim 1, further comprising:
    a discharge clog removing mechanism for removing said conductive metal which has solidified in the vicinity of the discharge opening of said drawing die.

23. The electric wiring forming system according to claim 1, wherein said electric wiring forming system comprises a plurality of sets having said cylinder, said screw, and said drawing die as one set.

24. The electric wiring forming system according to claim 23, wherein said drawing die of each of said sets has a plurality of discharge openings.

25. The electric wiring forming system according to claim 1, further comprising a dispenser for discharging ink onto said board for mounting electrical elements.

26. The electric wiring forming system according to claim 1, further comprising a board inverting unit for inverting the front and back sides of said board for mounting electrical elements.

* * * * *